United States Patent
Hsu et al.

(10) Patent No.: US 12,002,663 B2
(45) Date of Patent: Jun. 4, 2024

(54) PROCESSING APPARATUS AND METHOD FOR FORMING SEMICONDUCTOR STRUCTURE

(71) Applicant: Taiwan Semiconductor Manufacturing Company, Ltd., Hsinchu (TW)

(72) Inventors: Yu-Rung Hsu, Tainan (TW); Li-Te Lin, Hsinchu (TW); Pinyen Lin, Rochester, NY (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/377,601

(22) Filed: Jul. 16, 2021

(65) Prior Publication Data

US 2023/0018022 A1     Jan. 19, 2023

(51) Int. Cl.
     *H01J 37/32*      (2006.01)
     *H01L 21/3065*      (2006.01)
     *H01L 21/311*      (2006.01)

(52) U.S. Cl.
CPC ..... *H01J 37/32743* (2013.01); *H01J 37/3211* (2013.01); *H01J 37/32449* (2013.01); *H01L 21/3065* (2013.01); *H01L 21/31116* (2013.01); *H01J 37/32568* (2013.01)

(58) Field of Classification Search
CPC ............. H01J 37/32743; H01J 37/3211; H01J 37/32449; H01J 37/32568; H01L 21/3065
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,229,815 B2 * | 3/2019 | Koshiishi | H01J 37/32137 |
| 2012/0211166 A1 * | 8/2012 | Yevtukhov | H01J 37/3053 250/424 |
| 2014/0209244 A1 * | 7/2014 | Banna | H01J 37/321 156/345.49 |

(Continued)

*Primary Examiner* — Binh X Tran
(74) *Attorney, Agent, or Firm* — McClure, Qualey & Rodack, LLP

(57) ABSTRACT

A processing apparatus is provided. The processing apparatus includes a chamber and a carrier that is positioned in the chamber for holding a substrate. The processing apparatus further includes a gas inlet connected to the chamber. The gas inlet is configured to supply a process gas into the chamber. The processing apparatus also includes a coil module positioned around the chamber and configured to transfer the process gas into plasma. In addition, the processing apparatus includes a filter disposed in the chamber. The coil module is configured to change a position of the plasma between a first position and a second position, the first position is located between the gas inlet and the filter, and the second position is located between the filter and the carrier.

20 Claims, 33 Drawing Sheets

(56) References Cited

U.S. PATENT DOCUMENTS

| | | | |
|---|---|---|---|
| 2014/0363977 A1* | 12/2014 | Morimoto | H01J 37/32183 |
| | | | 438/711 |
| 2015/0170886 A1* | 6/2015 | Morimoto | H01J 37/32165 |
| | | | 156/345.24 |
| 2017/0125260 A1* | 5/2017 | Tan | H01J 37/32715 |
| 2019/0371898 A1* | 12/2019 | Huang | H01L 29/7853 |
| 2021/0343506 A1* | 11/2021 | Xie | H01J 37/32422 |
| 2022/0068607 A1* | 3/2022 | Ventzek | H01J 37/3244 |
| 2023/0282448 A1* | 9/2023 | Shoeb | H01J 37/32183 |
| | | | 315/111.21 |

* cited by examiner

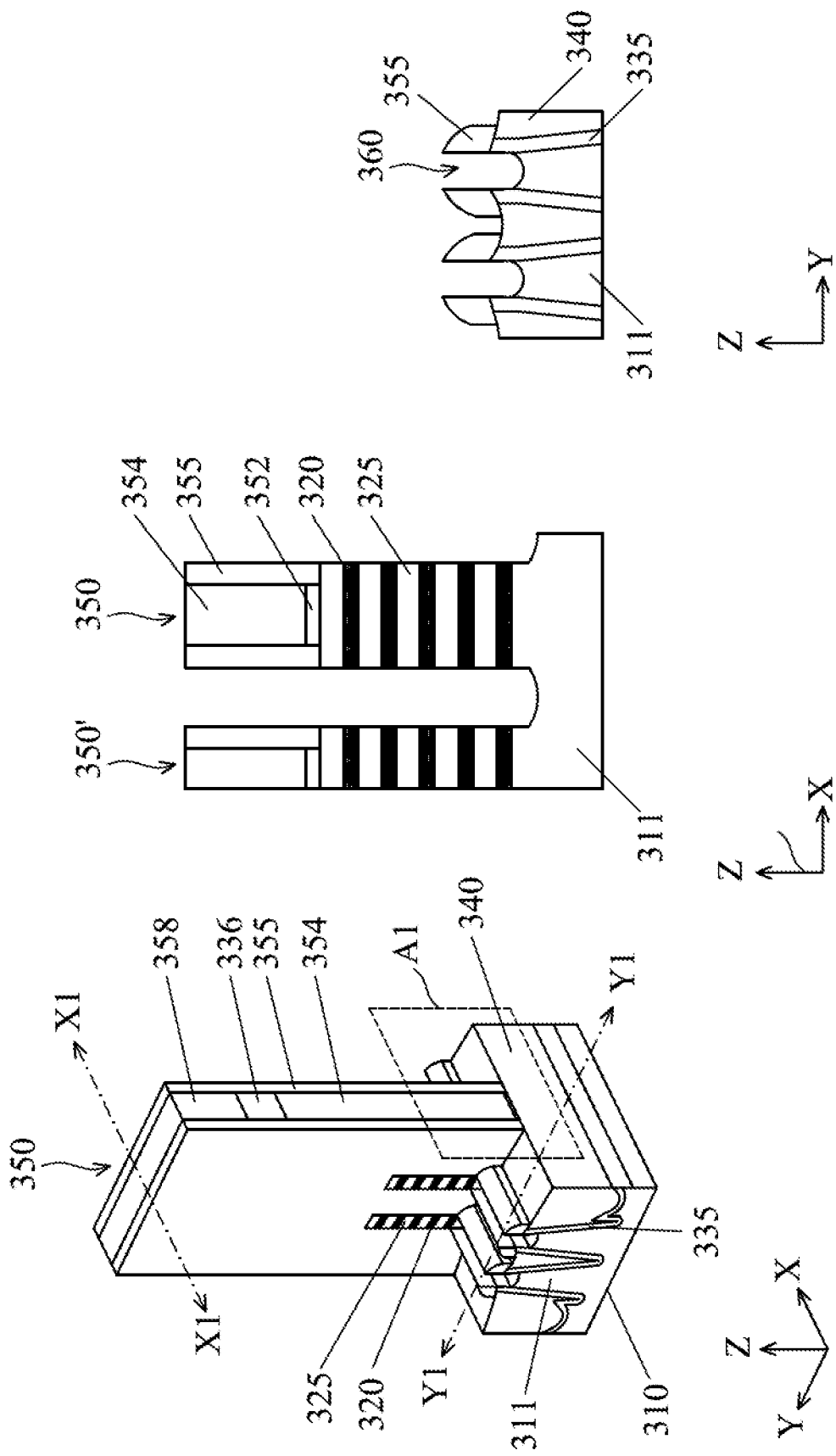

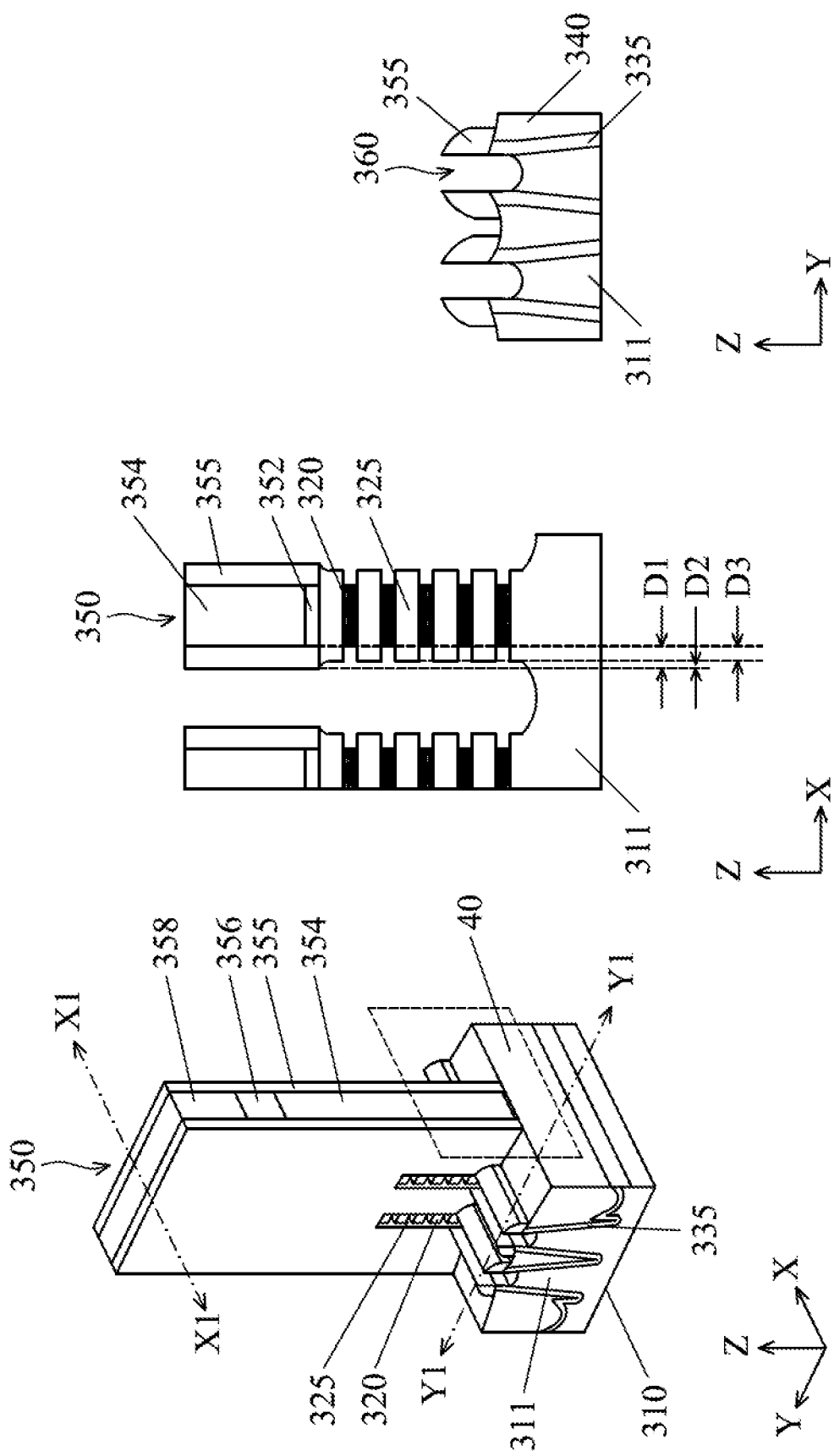

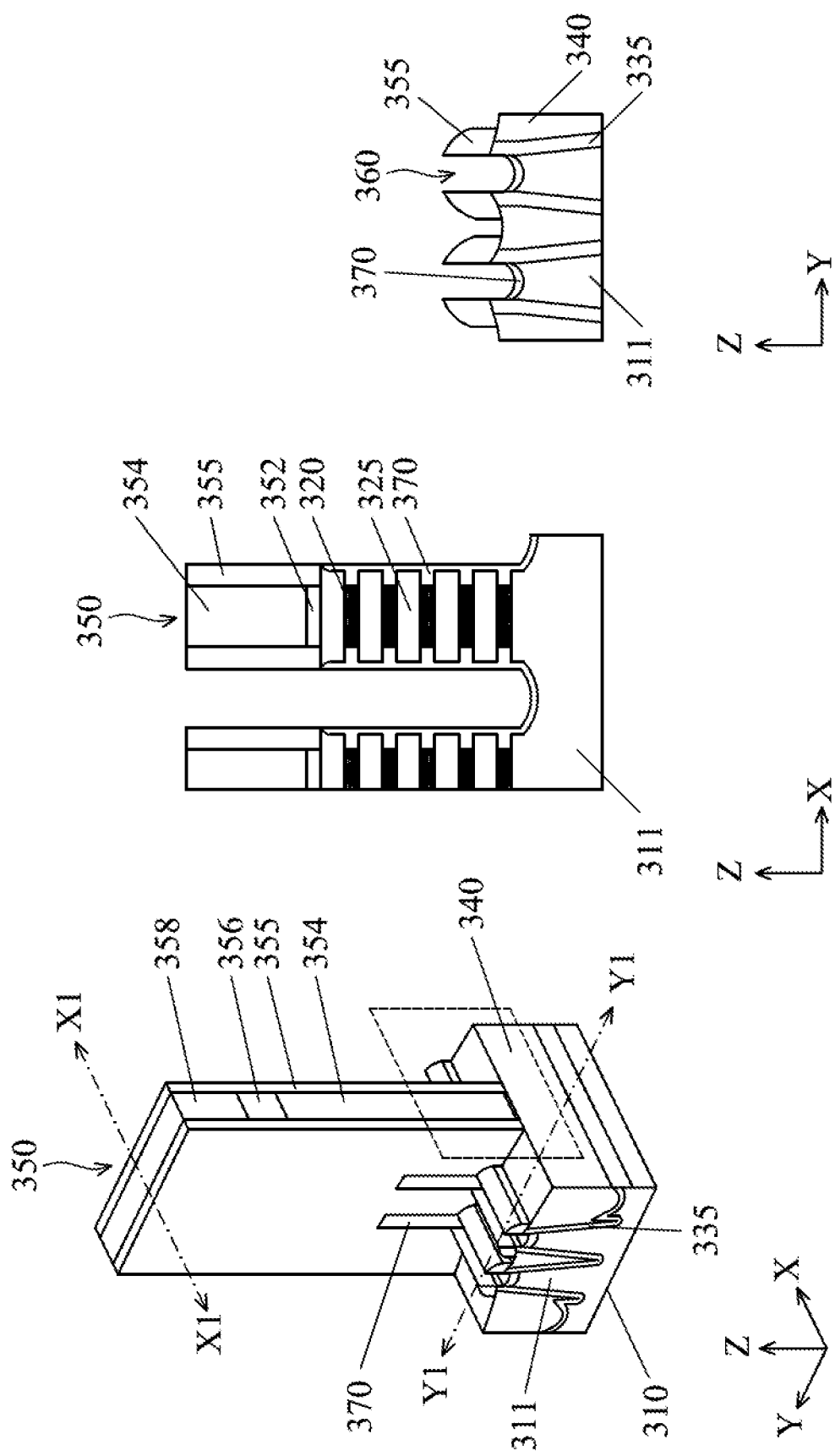

PROCESSING APPARATUS AND METHOD FOR FORMING SEMICONDUCTOR STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 6-13, 14A, 14B, 14C, 15A, 15B, 15C, 16A, 16B, 16C, 17-19, 20A, 20B, 21-24, 25A, 25B, and 25C show exemplary sequential processes for forming the GAA (gate-all-around) FET device, in accordance with some embodiments of the disclosure.

DETAILED DESCRIPTION

Figure 1A:
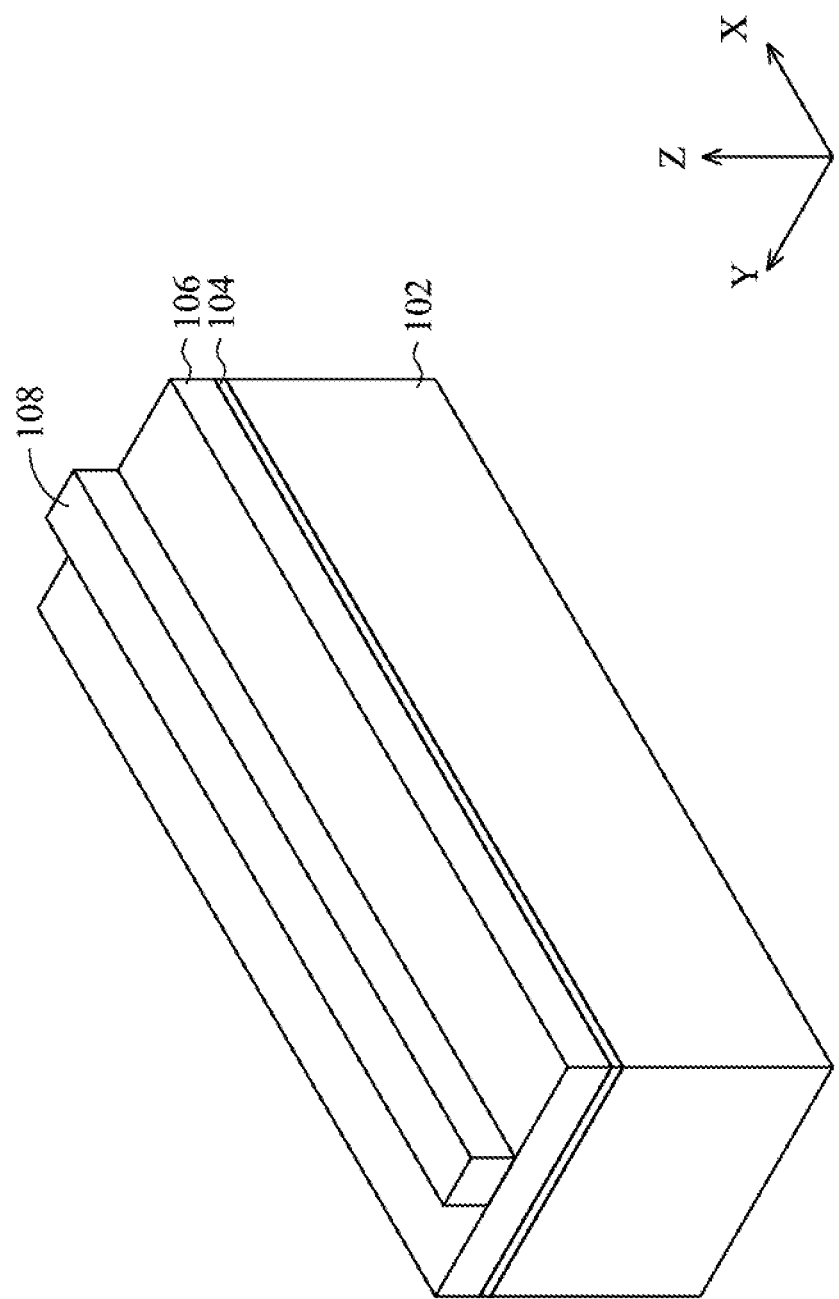
FIGS. 1A-1I are perspective representations of various stages of forming a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Embodiments of a processing apparatus and method for forming semiconductor structure are provided. The processing apparatus may include a chamber, a first coil, a second coil, and a grounded filter. The first coil and the second coil around the chamber transform the process gas into plasma, and the grounded filter may guide some of the plasma to switch different types of etching processes performed by the processing apparatus. Since different etching processes are performed in-situ in single processing apparatus, the required time and cost for forming semiconductor structure may be reduced.

FIGS. 1A-1I are perspective representations of various stages of forming a semiconductor structure, in accordance with some embodiments of the disclosure. A substrate 102 is provided, as shown in FIG. 1A in accordance with some embodiments. The substrate 102 is a semiconductor wafer such as a silicon wafer. Alternatively or additionally, the substrate 102 includes elementary semiconductor materials, compound semiconductor materials, and/or alloy semiconductor materials. Examples of the elementary semiconductor materials include, but are not limited to, crystal silicon, polycrystalline silicon, amorphous silicon, germanium, and/or diamond. Examples of the compound semiconductor materials include, but are not limited to, silicon carbide, gallium arsenic, gallium phosphide, indium phosphide, indium arsenide, and/or indium antimonide. Examples of the alloy semiconductor materials include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a patterned photoresist layer 108 is formed over the mask layer 106, as shown in FIG. 1A in accordance with some embodiments. In some embodiments, the patterned photoresist layer 108 is formed by a deposition process and a patterning process.

The deposition process for forming the patterned photoresist layer 108 includes a chemical vapor deposition (CVD) process, a high-density plasma chemical vapor deposition (HDPCVD) process, a spin-on process, a sputtering process, or another applicable process. The patterning process for forming the patterned photoresist layer 108 includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

Moreover, the dielectric layer 104 is a buffer layer between the substrate 102 and the mask layer 106. In some embodiments, the dielectric layer 104 is used as a stop layer when the mask layer 106 is removed. In some embodiments, the dielectric layer 104 is made of silicon oxide. The mask layer 106 is made of silicon oxide, silicon nitride, silicon oxynitride, or another applicable material. In some other embodiments, more than one mask layer 106 is formed over the dielectric layer 104.

The dielectric layer 104 and the mask layer 106 is formed by deposition processes, which includes a chemical vapor deposition (CVD) process, a high-density plasma chemical vapor deposition (HDPCVD) process, a spin-on process, a sputtering process, or another applicable process.

Figure 1B:
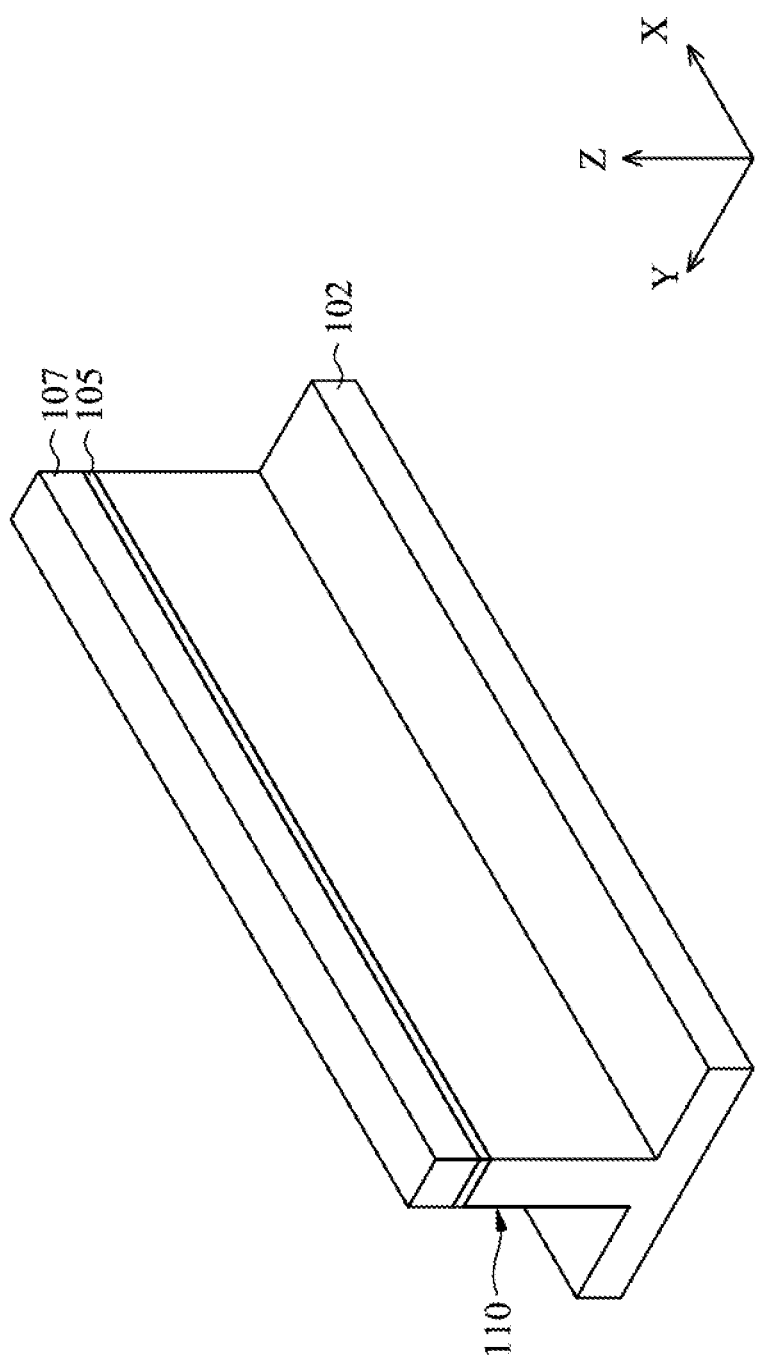

After the patterned photoresist layer 108 is formed, the dielectric layer 104 and the mask layer 106 are patterned by using the patterned photoresist layer 108 as a mask, as shown in FIG. 1B in accordance with some embodiments. As a result, a patterned dielectric layer 105 and a patterned mask layer 107 are obtained. Afterwards, the patterned photoresist layer 108 is removed.

Next, an etching process is performed on the substrate 102 to form a fin structure 110 by using the patterned dielectric layer 105 and the patterned mask layer 107 as a mask. The etching process is a dry etching process or a wet etching process.

In some embodiments, the substrate 102 is etched by a dry etching process. The dry etching process includes using a fluorine-based etchant gas, such as SF6, CxFy, NF3 or a combination thereof. The etching process is a time-controlled process, and continue until the fin structure 110 reaches a predetermined height. In some other embodiments, the fin structure 110 has a width that gradually increases from the top portion to the lower portion.

Figure 1C:
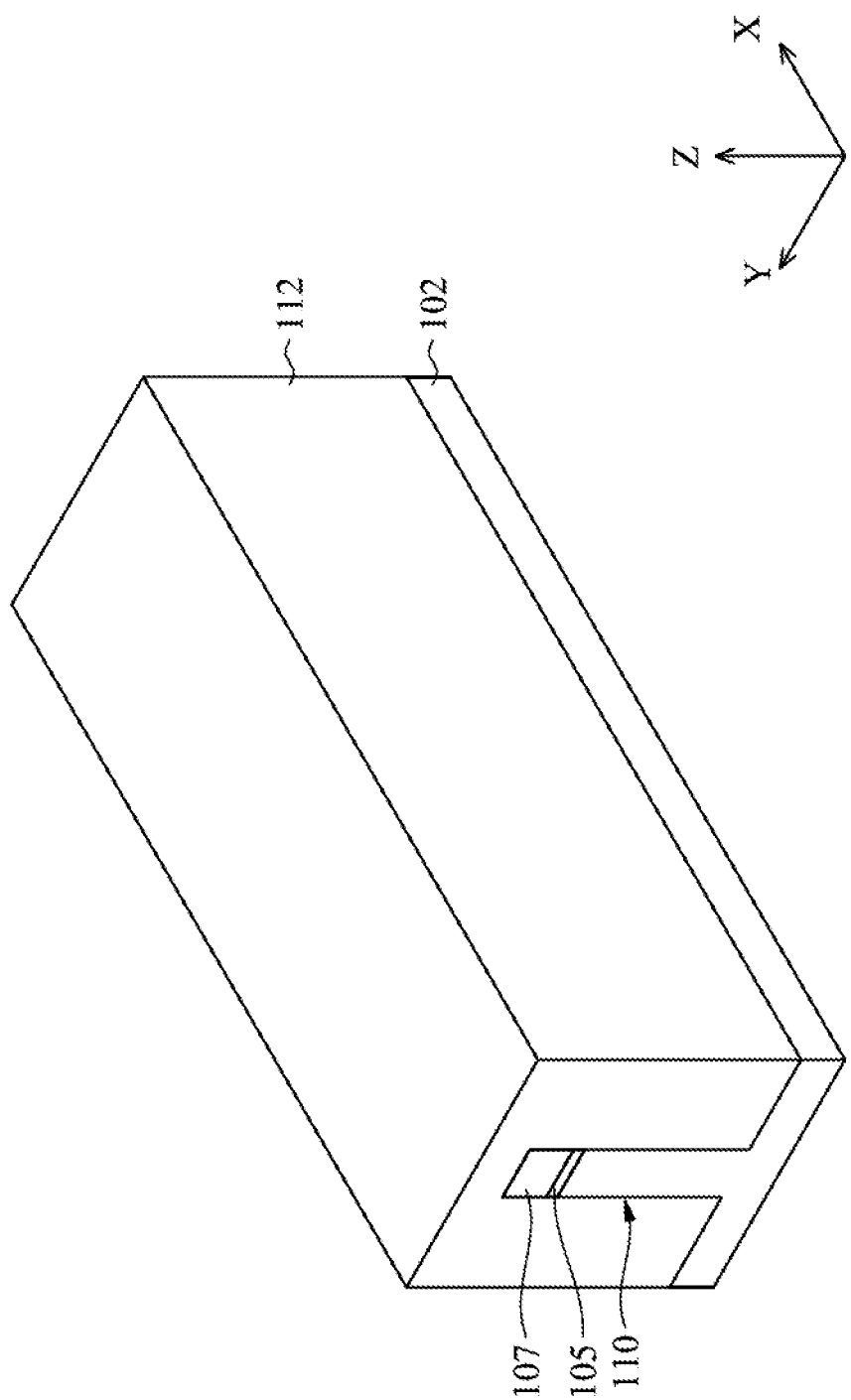

After the fin structure 110 is formed, an insulating layer 112 is formed to cover the fin structure 110, the patterned pad layer 105, and the patterned mask layer 107 over the substrate 102, as shown in FIG. 1C in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 is deposited by a chemical vapor deposition (CVD) process, a spin-on-glass process, or another applicable process.

Next, the insulating layer 112 is thinned or planarized to expose the top surface of the patterned mask layer 107. In some embodiments, the insulating layer 112 is thinned by a chemical mechanical polishing (CMP) process. Afterwards, the patterned dielectric layer 105 and the patterned mask layer 107 are removed.

Figure 1D:
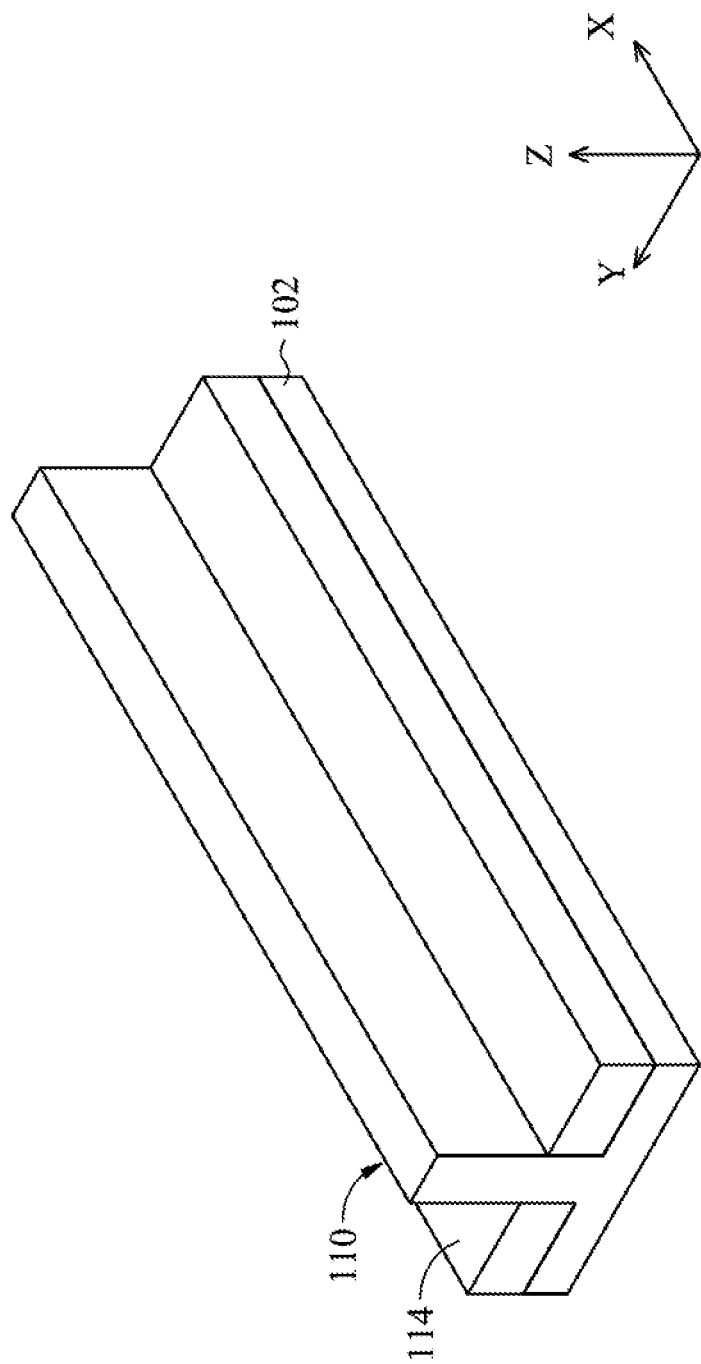

After the patterned dielectric layer 105 and the patterned mask layer 107 are removed, an upper portion of the insulating layer 112 is removed to form an isolation structure 114, as shown in FIG. 1D in accordance with some embodiments. The isolation structure 114 is a shallow trench isolation (STI) structure surrounding the fin structure 110.

In some embodiments, a portion of the fin structure 110 is embedded in the isolation structure 114. More specifically, a lower portion of the fin structure 110 is surrounded by the isolation structure 114, while an upper portion of the fin structure 110 protrudes from the isolation structure 114. The isolation structure 114 is configured to prevent electrical interference or crosstalk.

Figure 1E:
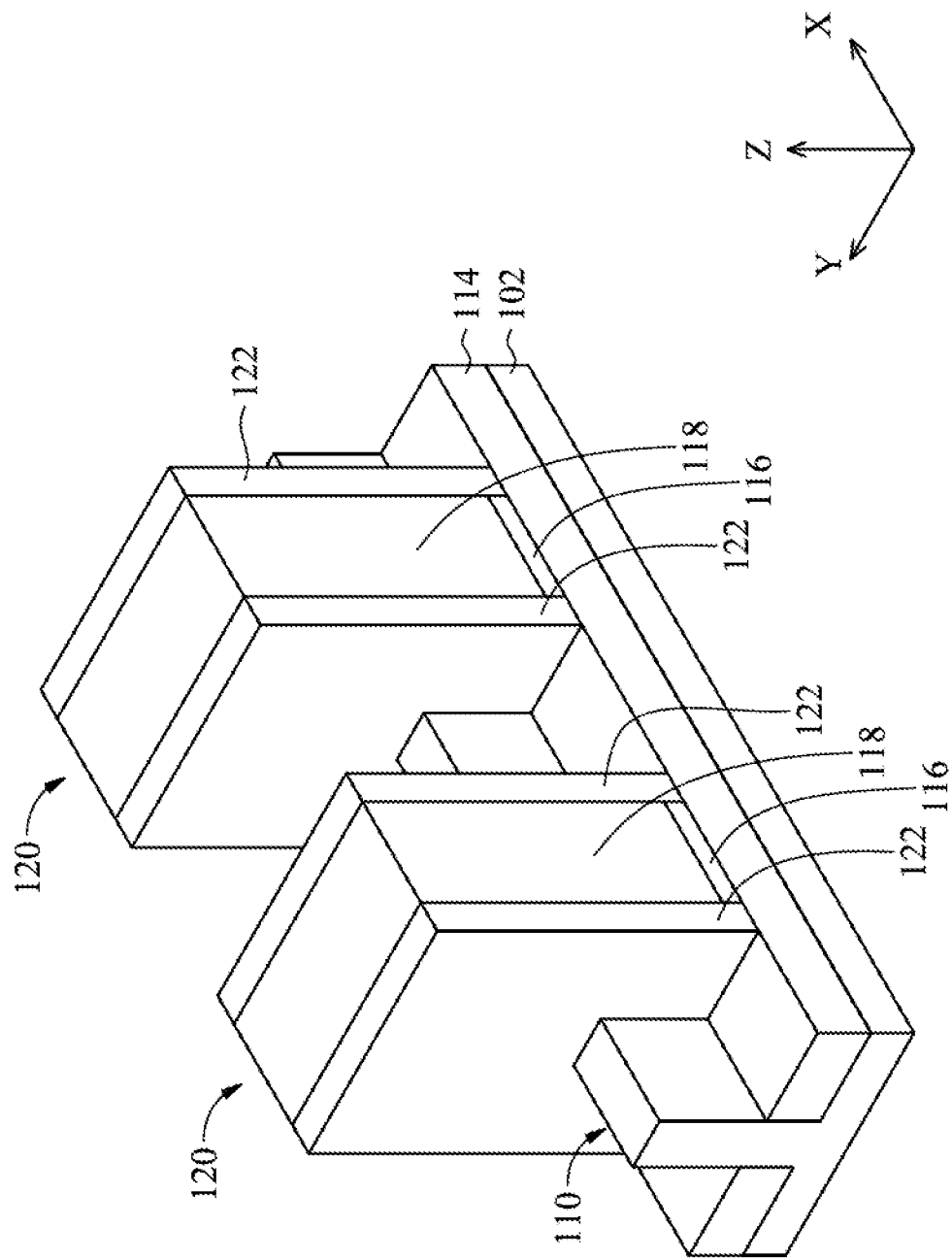

After the isolation structure 114 is formed, dummy gate structures 120 are formed across the fin structure 110 and extend over the isolation structure 114, as shown in FIG. 1E in accordance with some embodiments. In some embodiments, each of the dummy gate structures 120 includes a dummy gate dielectric layer 116 and a dummy gate electrode layer 118 formed over the dummy gate dielectric layer 116. After the dummy gate structures 120 are formed, gate spacers 122 are formed on opposite sidewalls of each of the dummy gate structures 120. Each of the gate spacers 122 is a single layer or multiple layers.

In order to improve the speed of the FinFET device structure, the gate spacers 122 are made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide.

In some other embodiments, the gate spacers 122 are made of an extreme low-k (ELK) dielectric material with a dielectric constant (k) less than about 2.5. In some embodiments, the ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

In addition, in some embodiments, the gate spacers 122 include air gaps (not shown) to further reduce their k value, such that the capacitances between the gate structures (formed subsequently) and the contacts (formed subsequently) electrically connected to the S/D structure (formed subsequently) is reduced.

Figure 1F:
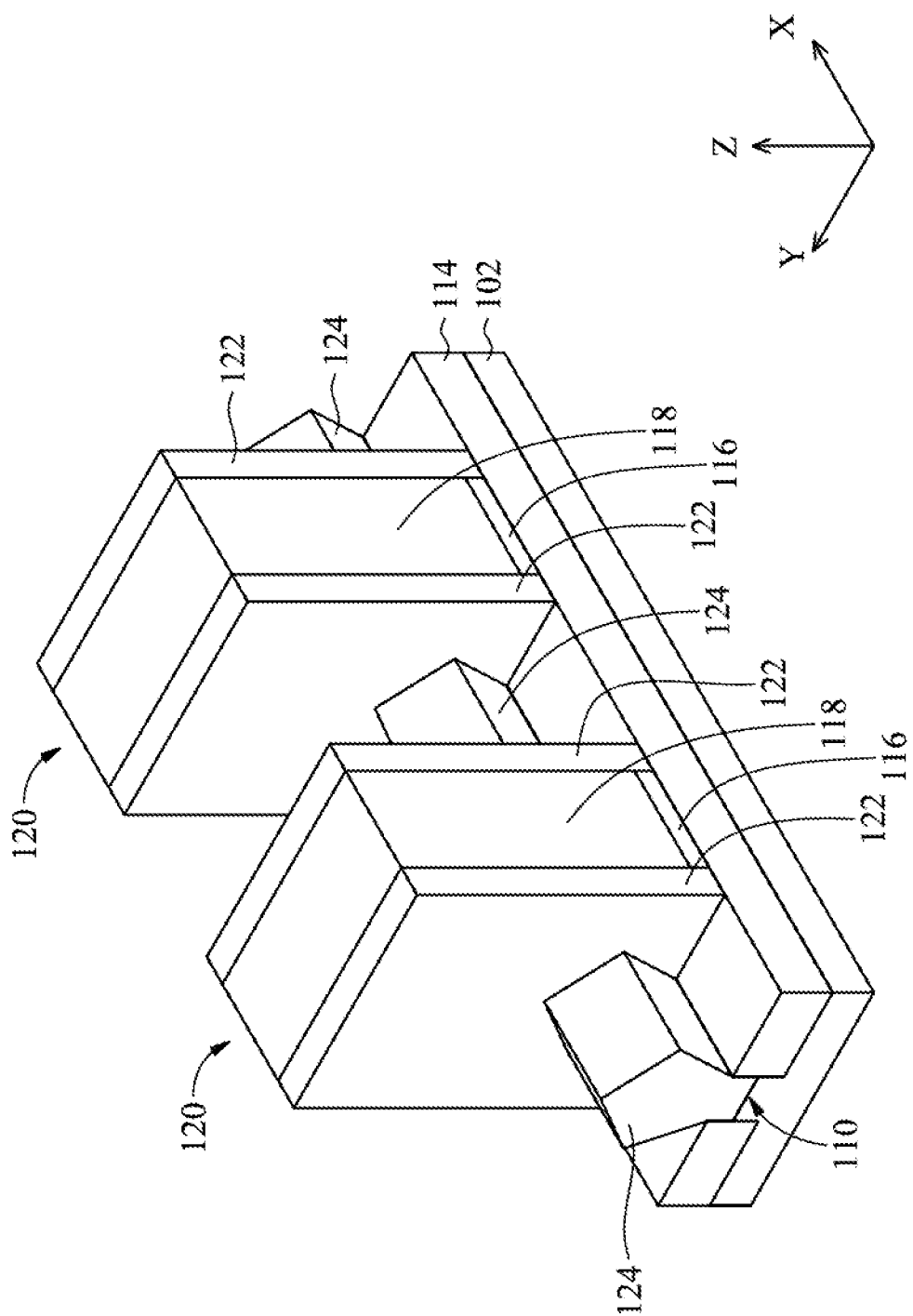

Afterwards, source/drain (S/D) structures 124 are formed over the fin structure 110, as shown in FIG. 1F in accordance with some embodiments. In some embodiments, portions of the fin structure 110 adjacent to the dummy gate structures 120 are recessed to form recesses at two sides of the fin structure 110, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like.

After the source/drain (S/D) structures 124 are formed, a contact etch stop layer (CESL) 126 is formed over the substrate 102, and an inter-layer dielectric (ILD) structure 128 is formed over the CESL 126. More specifically, the CESL 126 is formed over the S/D structures 124, the isolation structure 114, and the sidewalls of the gate spacers 122. In some embodiments, the CESL 126 is made of silicon nitride, silicon oxynitride, and/or other applicable materials. Moreover, the CESL 126 is formed by plasma enhanced CVD, low-pressure CVD, atomic layer deposition (ALD), or other applicable processes.

In some embodiments, the ILD structure 128 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzocyclobutenes (BCB), or polyimide. In addition, the ILD structure 128 is formed by chemical vapor deposition (CVD), physical vapor deposition, (PVD), atomic layer deposition (ALD), spin-on coating, or another applicable process.

Figure 1G:
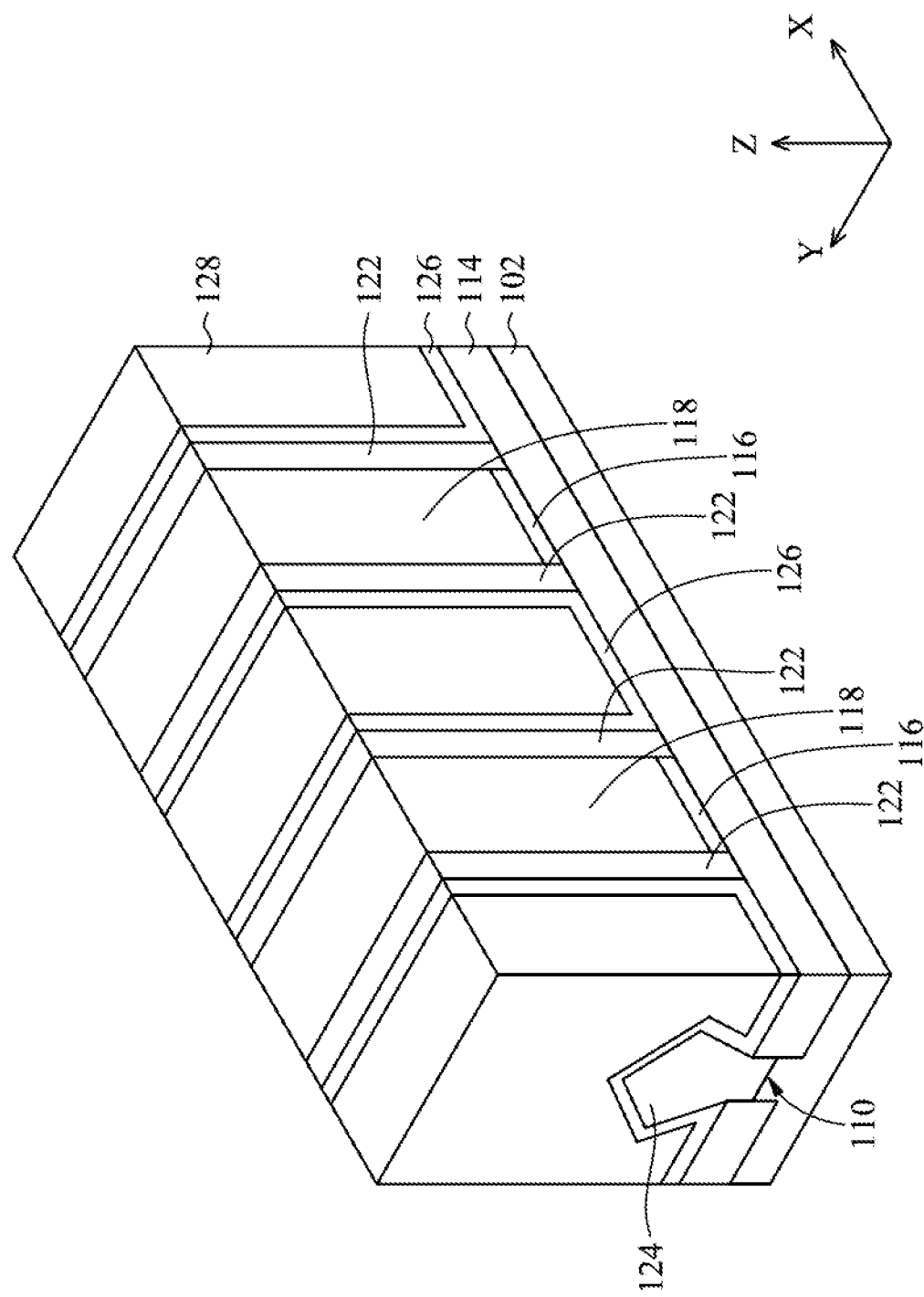

Afterwards, a planarizing process is performed on the ILD structure 128 until the top surfaces of the dummy gate structures 120 are exposed, as shown in FIG. 1G in accordance with some embodiments. After the planarizing process, the top surfaces of the dummy gate structures 120 is substantially level with the top surfaces of the gate spacers 122 and the ILD structure 128. In some embodiments, the planarizing process includes a grinding process, a chemical mechanical polishing (CMP) process, an etching process, another applicable process, or a combination thereof.

Figure 1H:
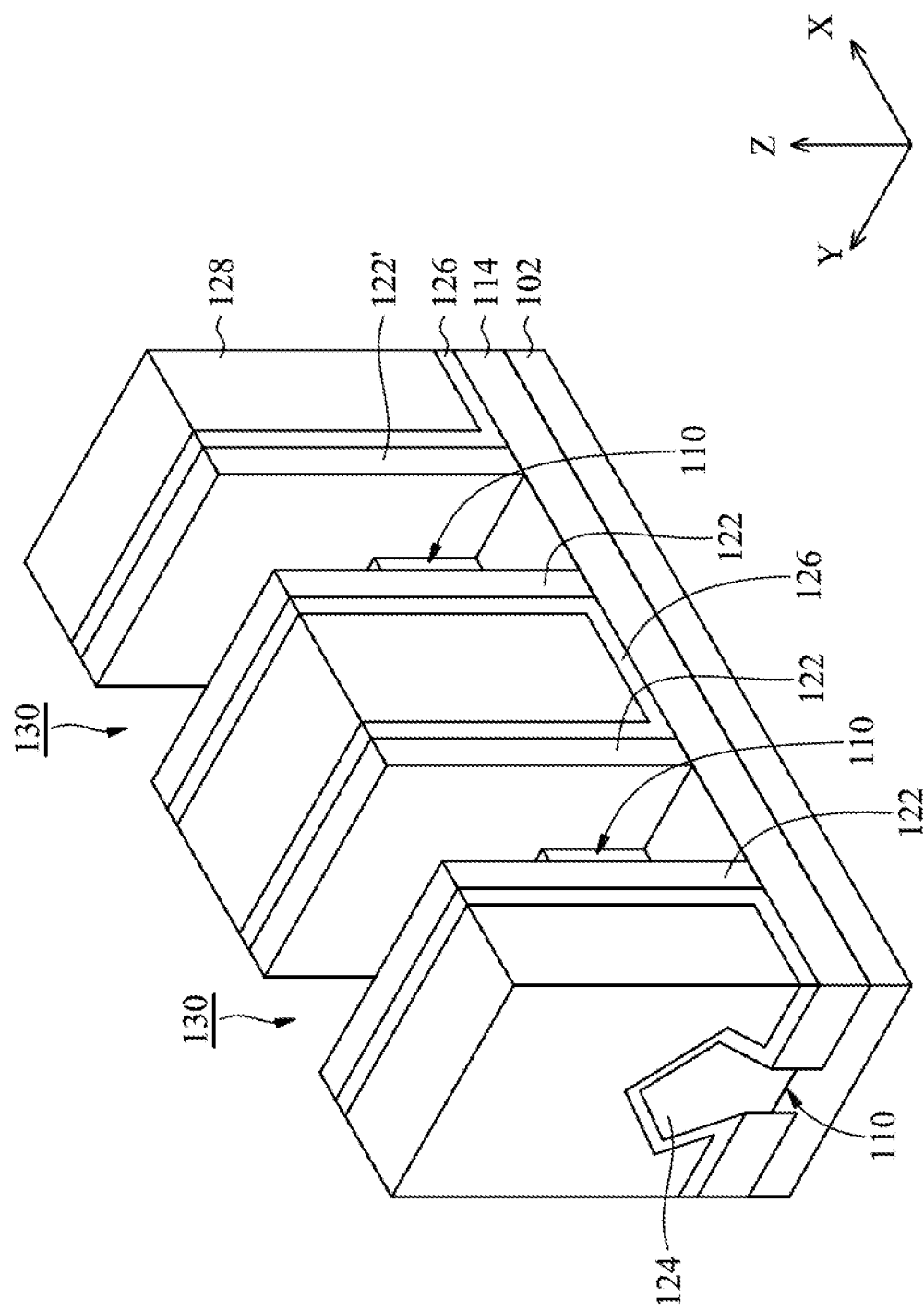

Next, the dummy gate structures 120 are removed to form trenches 130 in the ILD structure 128, as shown in FIG. 1H in accordance with some embodiments. More specifically, each of the trenches 130 is formed between each pair of the gate spacers 122, and the fin structure 110 is exposed by the trenches 130. The dummy gate dielectric layer 116 and the dummy gate electrode layer 118 are removed by an etching process, such as a dry etching process or a wet etching process.

Figure 1I:
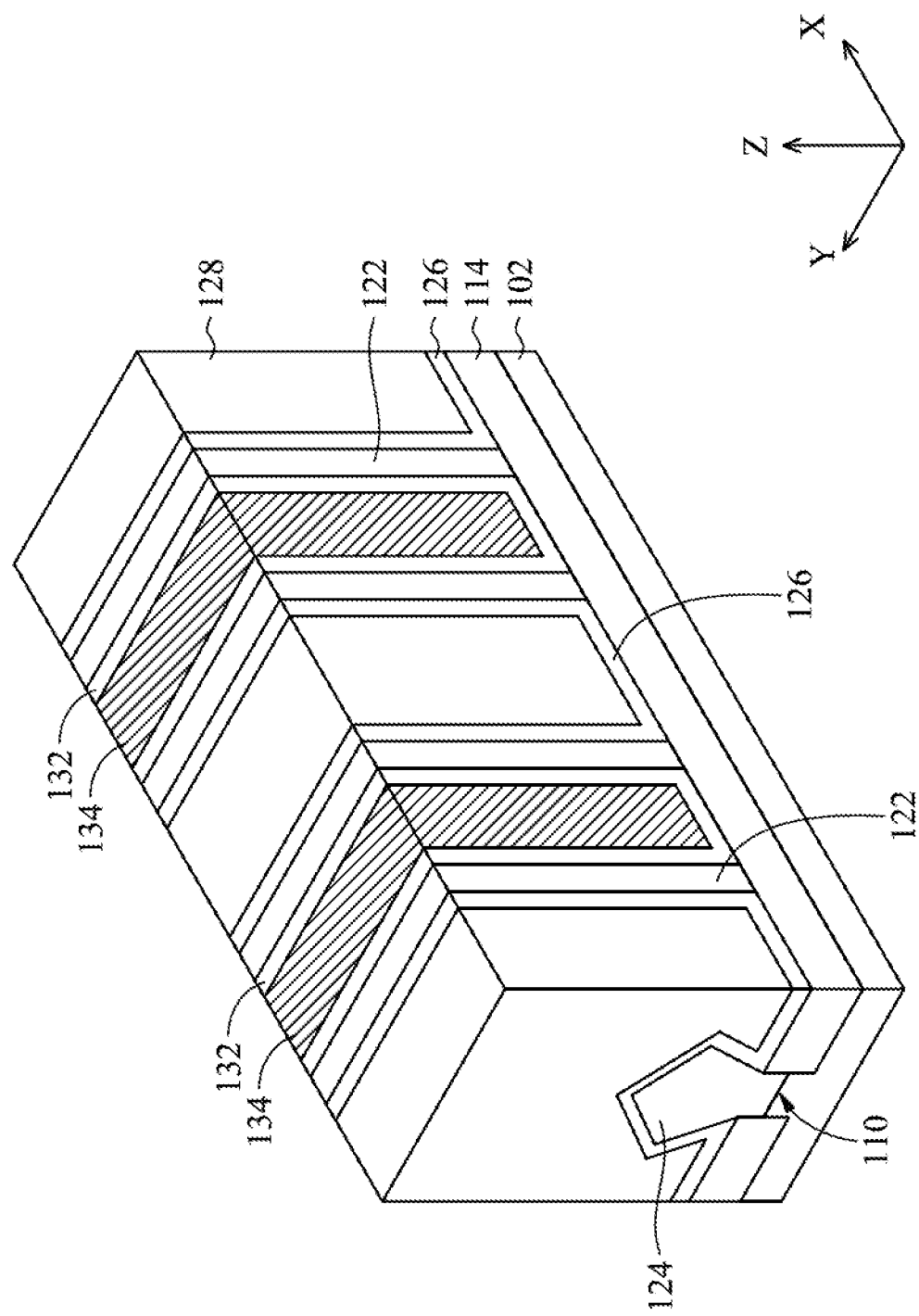

After the trenches 130 are formed, gate dielectric layers 132 and gate electrode layers 134 are formed in the trenches 130, as shown in FIG. 1I in accordance with some embodiments. More specifically, the gate electrode layers 134 are formed over the gate dielectric layers 132, and sidewalls of the gate electrode layers 134 is covered by the gate dielectric layers 132. In addition, work function layers (not shown) are formed between each of the gate dielectric layers 132 and each of the gate electrode layers 134.

Each of the gate dielectric layers 132 is a single layer or multiple layers. In some embodiments, the gate dielectric layers 132 are made of silicon oxide, silicon nitride, silicon oxynitride (SiON), dielectric material(s) with high dielectric constant (high-k), or a combination thereof. In some embodiments, the gate dielectric layers 132 are deposited by a plasma enhanced chemical vapor deposition (PECVD) process or a spin coating process.

Moreover, the gate electrode layers 134 are made of a conductive material such as aluminum (Al), copper (Cu), tungsten (W), titanium (Ti), tantalum (Ta), or another applicable material, in accordance with some embodiments. The gate electrode layers 134 are formed by a deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process.

The work function layers are made of metal materials, and the metal materials include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

Figure 2A:
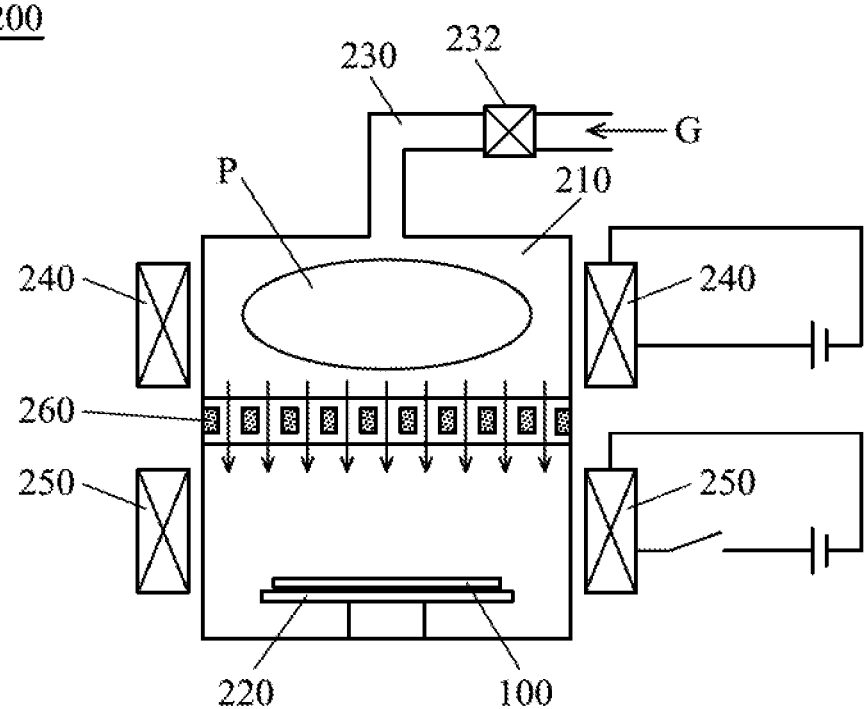
FIGS. 2A, 3A, and 4A are cross-sectional views illustrating a processing apparatus for forming a semiconductor structure, in accordance with some embodiments of the disclosure.
Figure 2B:
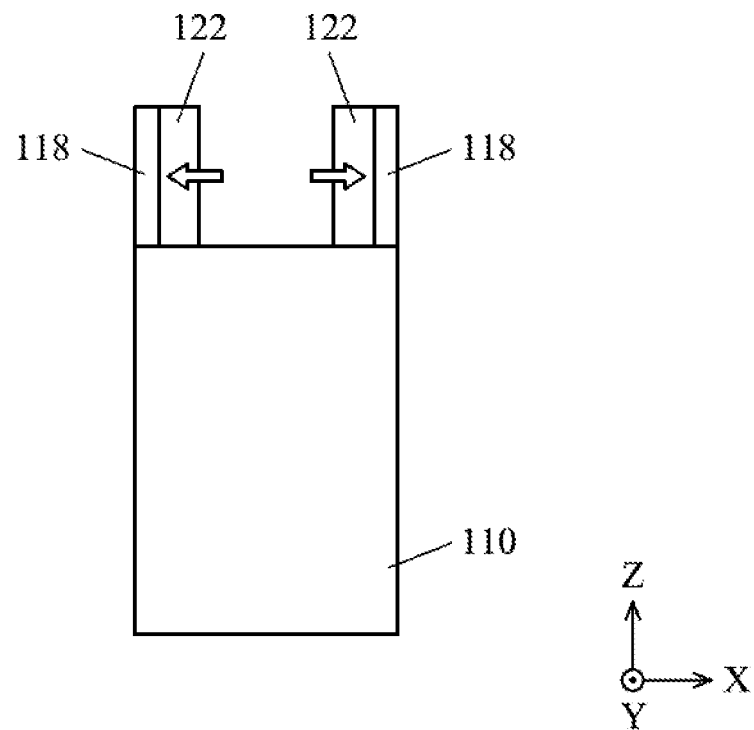
FIGS. 2B, 3B, and 4B are partial cross-sectional views illustrating a semiconductor structure, in accordance with some embodiments of the disclosure.

FIG. 2A is a cross-sectional view illustrating a processing apparatus 200 for forming a semiconductor structure, in accordance with some embodiments of the disclosure. FIG. 2B is a cross-sectional view illustrating a semiconductor structure, in accordance with some embodiments of the disclosure. For example, the processing apparatus 200 is configured to perform an etching process to the semiconductor structure. The detailed description for the operation of the processing apparatus 200 and the corresponding semiconductor structure is provided as follows.

As shown in FIG. 2A, the processing apparatus 200 includes a chamber 210 and a carrier 220 disposed at a bottom of the chamber 210 for holding a substrate 100. For example, the substrate 100 includes a semiconductor structure as shown in FIG. 1E, but it is not limited thereto. The processing apparatus 200 further includes a gas inlet 230 connected to the chamber 210. The gas inlet 230 is configured to supply a process gas G into the chamber 210. A shutter 232 is disposed in the gas inlet 230 to control the flow of the process gas G into the chamber 210. In the present embodiment, the processing apparatus 200 also includes a first coil 240 and a second coil 250 adjacent to the first coil 240. The first coil 240 and the second coil 250 are positioned around the chamber 210 and configured to transfer the process gas G into plasma P. In addition, the processing apparatus 200 includes a filter 260 disposed in the chamber 210. The first coil 240 and the second coil 250 are disposed on opposite sides (such as the upper side and the lower side shown in FIG. 2A) of the filter 260. That is, the filter 260 is located between the first coil 240 and the second coil 250. In some embodiment, the filter 260 is grounded.

Referring to FIG. 2A, the first coil 240 is turned on (i.e. electrically connected to a power source) and the second coil 250 is turned off (i.e. not electrically connected to a power source). It is noted that the circuits regarding the first coil 240 and the second coil 250 are illustrative in order to clearly understand if the first coil 240 and the second coil 250 are turned on. However, it is not intended to limit the electrical connection between the first coil 240 and the second coil 250. Any suitable circuit may be formed as long as the first coil 240 and the second coil 250 can be turned on and off. The process gas G enters the chamber 210 and is transformed into the plasma P at a first position by the first coil 240 (which is turned on at this stage). Then, the plasma P passes through the filter 260. Since the filter 260 is grounded, ions, electrons and other charged particles in the plasma P are intercepted by the filter 260. Therefore, the remaining radicals in the plasma P flow downward (i.e. toward the substrate 100). As such, a chemical etching process is performed to the semiconductor structure on the substrate 100. Meanwhile, as shown in FIG. 2B, the gate spacers 122 are laterally-etched and trimmed (shown as the arrows in FIG. 2B). That is, the space between the adjacent gate spacers 122 is widened for subsequent process.

For example, in the embodiment shown in FIG. 2A, the process gas G includes $NF_3$, $NH_3$, He, $H_2$ or any other suitable gas. In some embodiments, the process gas G is supplied in a range from about 50 standard cubic centimeter per minute (sccm) to 5000 sccm. The pressure of the chamber 210 is under about 20 mTorr to about 1 Torr. In some embodiments, the power of the first coil 240 is in a range from about 10 W to about 500 W. The period of time of the chemical etching process is in a range from about 10 sec to 60 sec.

Figure 3A:
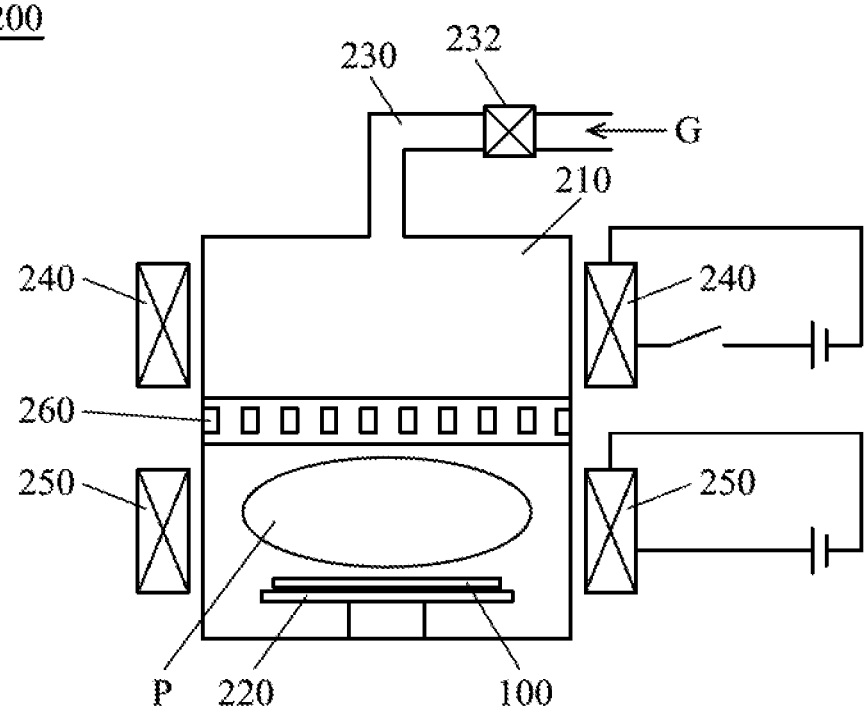
Figure 3B:
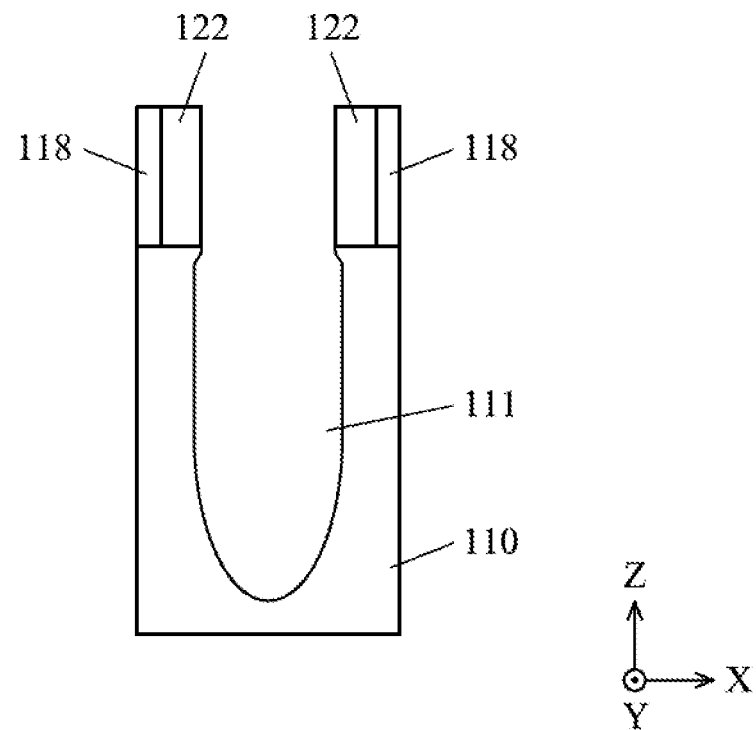

FIG. 3A is cross-sectional views illustrating the processing apparatus 200 for forming the semiconductor structure, in accordance with some embodiments of the disclosure. FIG. 3B is a cross-sectional view illustrating the semiconductor structure, in accordance with some embodiments of the disclosure. Referring to FIG. 3A, after the above chemical etching process is performed, the first coil 240 is turned off (i.e. not electrically connected to a power source) and the second coil 250 is turned on (i.e. electrically connected to a power source). The process gas G enters the chamber 210 and is transformed into the plasma P at a second position by the second coil 250 (which is turned on at this stage), and therefore the plasma P would not pass through and be filtered by the filter 260. In addition, a bias is applied to a bottom electrode (not shown) in the carrier 220. As such, a plasma etching process is performed to the semiconductor structure on the substrate 100. Meanwhile, as shown in FIG. 3B, a U-shaped recess 111 is formed in the fin structure 110. For example, the U-shaped recess 111 is formed by an anisotropic etching process for epitaxially growing S/D structures 124 in subsequent process.

For example, in the embodiment shown in FIG. 3A, the process gas G includes HBr, $Cl_2$, He, or any other suitable gas. In some embodiments, the process gas G is supplied in a range from about 20 standard cubic centimeter per minute (sccm) to 200 sccm. The pressure of the chamber 210 is under about 1 mTorr to about 10 mTorr. In some embodiments, the power of the second coil 250 is in a range from about 10 W to about 500 W. The voltage of the applied bias is in a range from about 100V to about 500V. The period of time of the plasma etching process is in a range from about 10 sec to 60 sec.

Figure 4A:
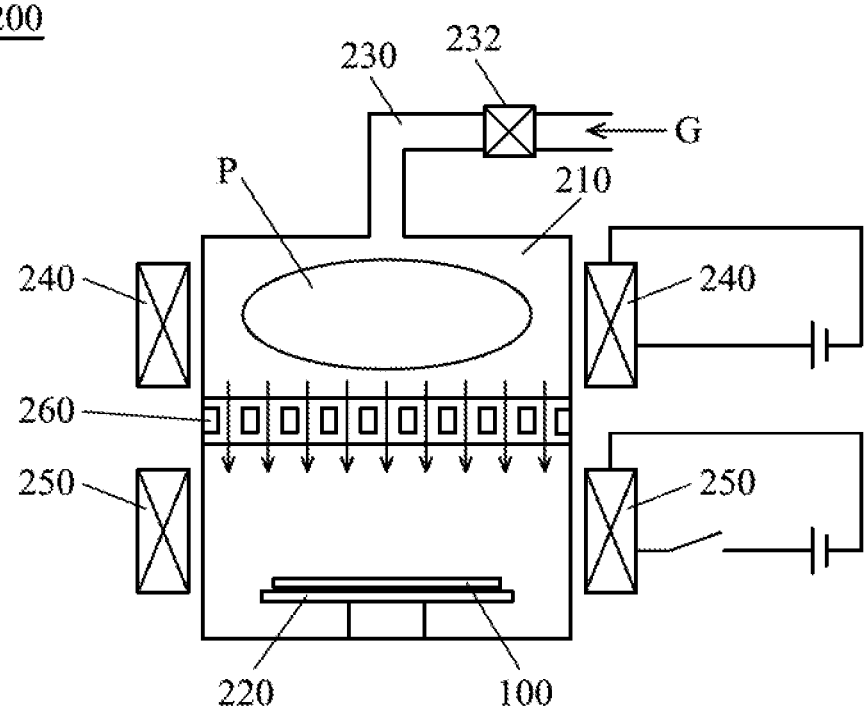
Figure 4B:
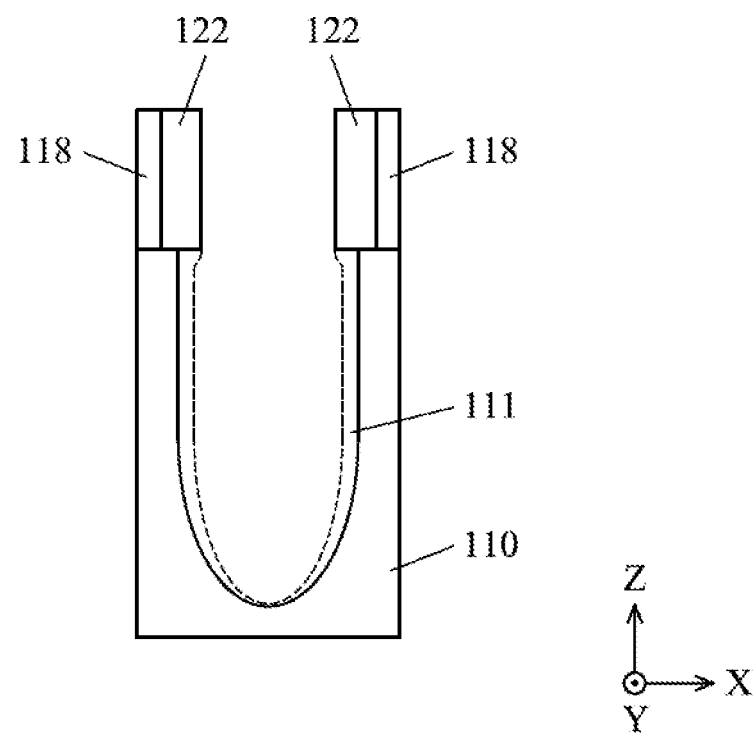

FIG. 4A is cross-sectional views illustrating the processing apparatus 200 for forming the semiconductor structure, in accordance with some embodiments of the disclosure. FIG. 4B is a cross-sectional view illustrating the semiconductor structure, in accordance with some embodiments of the disclosure. After the above plasma etching process is performed, the first coil 240 is turned on and the second coil 250 is turned off for performing a chemical etching process. Since the principle of operation at this stage is similar to that shown in FIG. 2A, the detailed description is not repeated for the sake of brevity. Meanwhile, as shown in FIG. 4B, the fin structure 110 in the recess 111 is laterally-etched from the dashed line. It is shown that the amount of etched fin structure 110 in X-axis is greater than the amount of etched fin structure 110 in Z-axis. As such, a smaller lateral proximity is obtained, and the semiconductor structure is improved with a higher mobility. However, the depth of the recess is substantially constant, and the drain induced barrier lowering (DIBL) and/or short channel effect (SCE) issue is avoided.

For example, in the embodiment shown in FIG. 4A, the process gas G includes $NF_3$, $Cl_2$, $H_2$, Ar, or any other suitable gas. In some embodiments, the process gas G is supplied in a range from about 5 standard cubic centimeter per minute (sccm) to 1500 sccm. The pressure of the chamber 210 is under about 10 mTorr to about 1 Torr. In some embodiments, the power of the first coil 240 is in a range from about 10 W to about 500 W. The period of time of the chemical etching process is in a range from about 10 sec to 60 sec.

In this way, a plasma directional etch and chemical isotropic/selective etch are performed in-situ in single apparatus and better process controllability and flexibility are obtained. The interfacial oxidation issues due to process changes between different tools are avoided. In addition, time consumption for forming the semiconductor structure is reduced since multiple etching processes are performed at the same process stage.

Figure 5A:
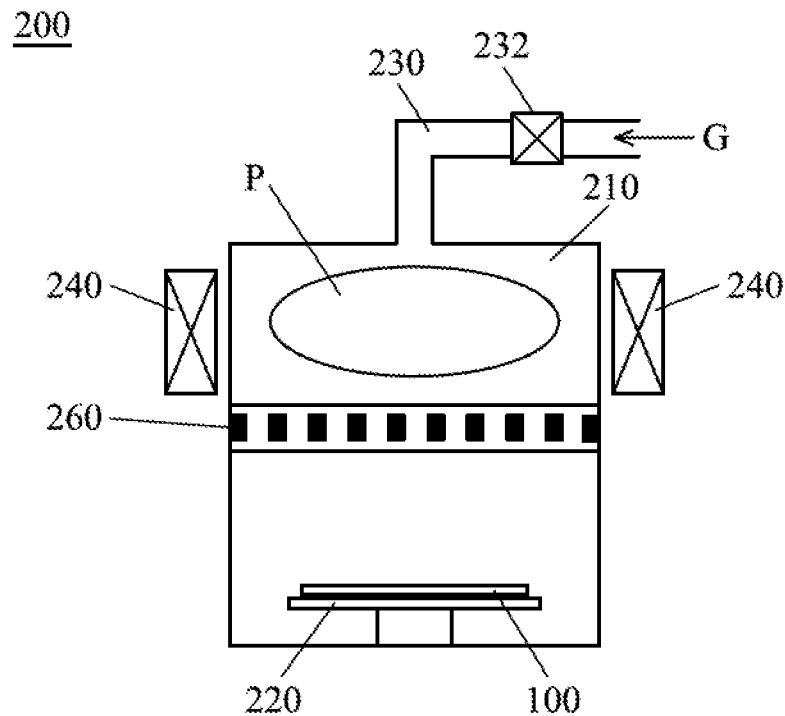
FIGS. 5A and 5B are cross-sectional views illustrating a processing apparatus for forming a semiconductor structure, in accordance with some embodiments of the disclosure.
Figure 5B:
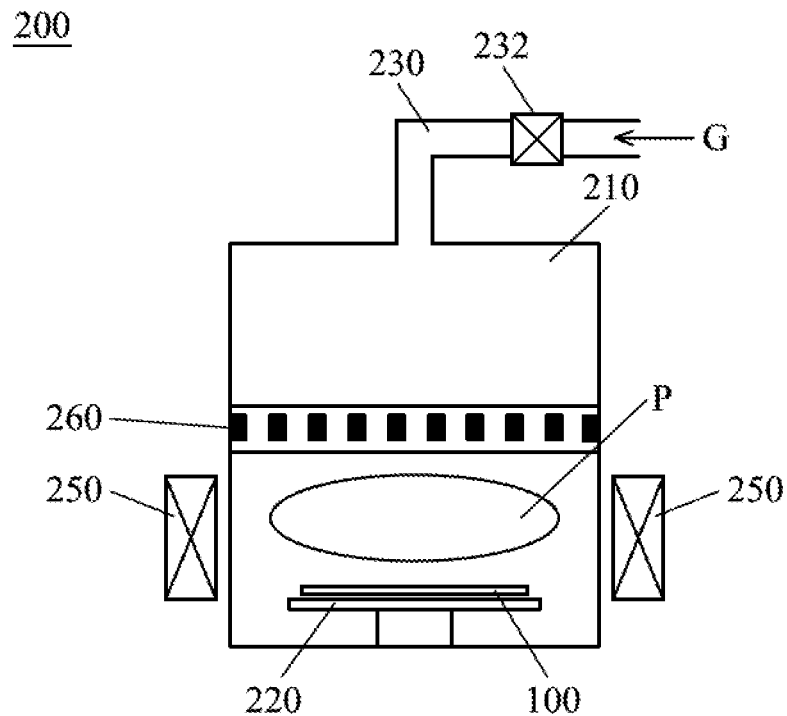

FIGS. 5A and 5B are cross-sectional views illustrating the processing apparatus 200 for forming a semiconductor structure, in accordance with some embodiments of the disclosure. In the present embodiment, the second coil 250 is omitted, and the first coil 240 is movable relative to the chamber 210. When the processing apparatus 200 is switched to a chemical etching mode, the first coil 240 is located between the gas inlet 230 and the filter 260. Therefore, the plasma P generated by the first coil 240 would pass through the grounded filter 260, leaving the radicals toward the substrate 100 for a chemical etching process. Otherwise, when the processing apparatus 200 is switched to a plasma etching mode, the first coil 240 is located between the filter 260 and the carrier 220. Therefore, the plasma P generated by the first coil 240 would not pass through the grounded filter 260 and be configured to perform a plasma etching process.

FIGS. 6-25C show exemplary sequential processes for forming the GAA FET device according to one embodiment of the present disclosure. It is understood that additional operations can be provided before, during, and after processes shown by FIGS. 6-25C, and some of the operations described below can be replaced or eliminated, for additional embodiments of the method. In some embodiments, the order of the operations/processes is interchangeable.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 6:
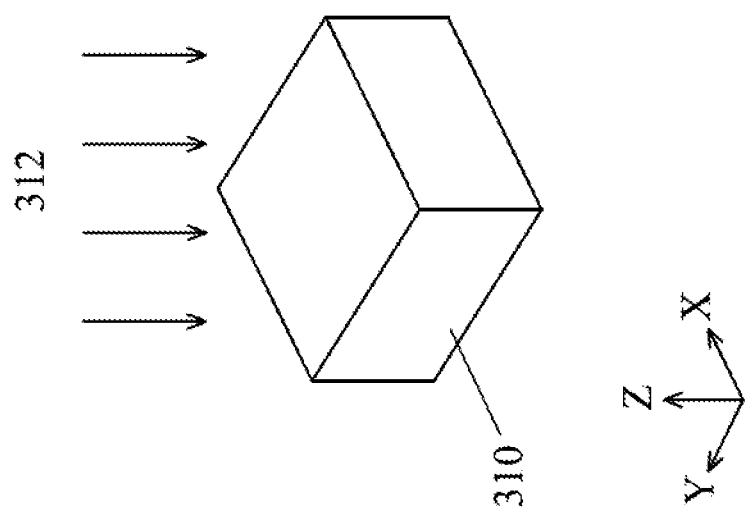

As shown in FIG. 6, impurity ions (dopants) 312 are implanted into a silicon substrate 310 to form a well region. The ion implantation is performed to prevent a punch-through effect.

In one embodiment, substrate 310 includes a single crystalline semiconductor layer on at least it surface portion. The substrate 310 includes a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 310 is made of Si.

The substrate 310 includes in its surface region, one or more buffer layers (not shown). The buffer layers can serve to gradually change the lattice constant from that of the substrate to that of the source/drain regions. In some embodiments, the buffer layers is formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 310 includes silicon germanium (SiGe) buffer layers epitaxially grown on the silicon substrate 310. In some embodiments, the germanium concentration of the SiGe buffer layers increases from 30 atomic % germanium for the bottom-most buffer layer to 70 atomic % germanium for the top-most buffer layer.

The substrate 310 includes various regions that have been suitably doped with impurities (e.g., p-type or n-type conductivity). The dopants 312 are, for example boron (BF2) for an n-type Fin FET and phosphorus for a p-type Fin FET.

Figure 7:
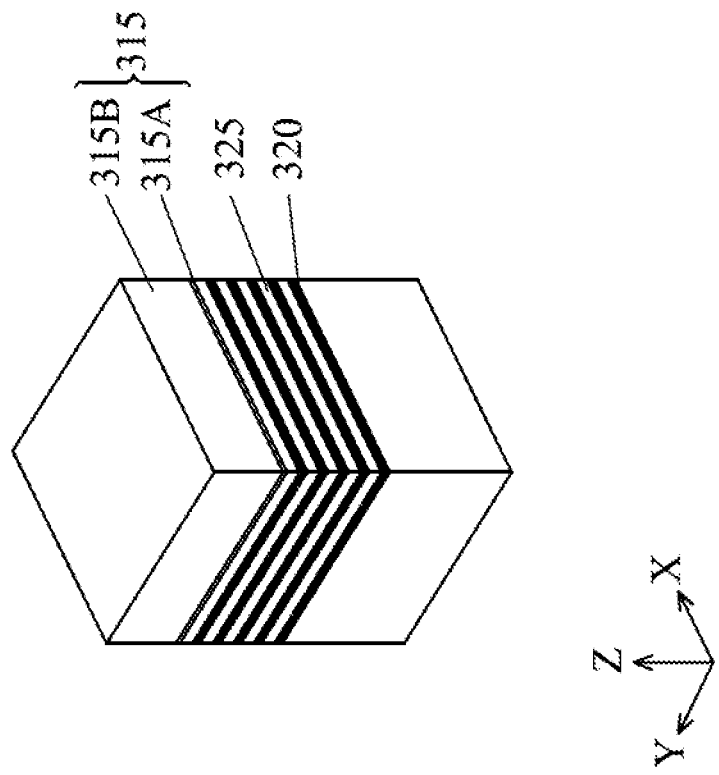

In FIG. 7, stacked semiconductor layers are formed over the substrate 310. The stacked semiconductor layers include first semiconductor layers 320 and second semiconductor layers 325. Further, a mask layer 315 is formed over the stacked layers.

The first semiconductor layers 320 and the second semiconductor layers 325 are made of materials having different lattice constants, and include one or more layers of Si, Ge, SiGe, GaAs, InSb, GaP, GaSb, InAlAs, InGaAs, GaSbP, GaAsSb or InP.

In some embodiments, the first semiconductor layers 320 and the second semiconductor layers 325 are made of Si, a Si compound, SiGe, Ge or a Ge compound. In one embodiment, the first semiconductor layers 320 are Si1-xGex, where x is more than about 0.3, or Ge (x=1.0) and the second semiconductor layers 325 are Si or Si1-yGey, where y is less than about 0.4, and x>y. In this disclosure, an "M" compound" or an "M based compound" means the majority of the compound is M.

In another embodiment, the second semiconductor layers 325 are Si1-yGey, where y is more than about 0.3, or Ge, and the first semiconductor layers 320 are Si or Si1-xGex, where x is less than about 0.4, and x<y. In yet other embodiments, the first semiconductor layer 320 is made of Si1-xGex, where x is in a range from about 0.3 to about 0.8, and the second semiconductor layer 325 is made of Si1-xGex, where x is in a range from about 0.1 to about 0.4.

In FIG. 7, five layers of the first semiconductor layer 320 and six layers of the second semiconductor layer 325 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 320 and the second semiconductor layers 325 are epitaxially formed over the substrate 310. The thickness of the first semiconductor layers 320 is equal to or greater than that of the second semiconductor layers 325, and is in a range from about 5 nm to about 50 nm in some embodiments, and is in a range from about 10 nm to about 30 nm in other embodiments. The thickness of the second semiconductor layers 25 is in a range from about 5 nm to about 30 nm in some embodiments, and is in a range from about 10 nm to about 20 nm in other embodiments. In some embodiments, the thickness of each of the first semiconductor layers 320 are the same, or vary from each other.

In some embodiments, the bottom first semiconductor layer (the closest layer to the substrate 310) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 315 includes a first mask layer 315A and a second mask layer 315B. The first mask layer 315A is a pad oxide layer made of a silicon oxide, which can be formed by a thermal oxidation. The second mask layer 315B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 315 is patterned into a mask pattern by using patterning operations including photo-lithography and etching.

Figure 8:
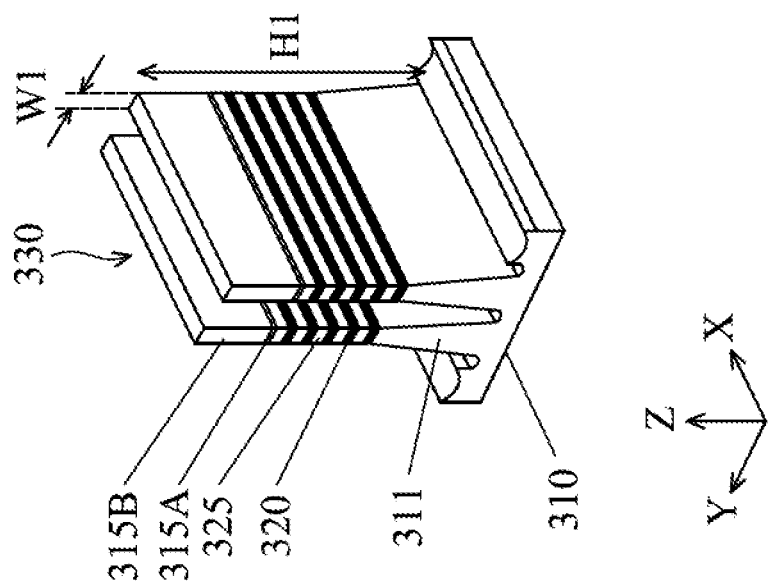

Next, as shown in FIG. 8, the stacked layers of the first and second semiconductor layers 320, 325 are patterned by using the patterned mask layer, thereby the stacked layers are formed into fin structures 330 extending in the X direction. In FIG. 3, two fin structures 330 are arranged in the Y direction. But the number of the fin structures is not limited to, and may be as small as one and three or more. In some embodiments, one or more dummy fin structures are formed on both sides of the fin structures 330 to improve pattern fidelity in the patterning operations.

As shown in FIG. 8, the fin structures 330 have upper portions constituted by the stacked semiconductor layers 320, 325 and well portions 311.

The width W1 of the upper portion of the fin structure along the Y direction is in a range from about 10 nm to about 40 nm in some embodiments, and is in a range from about 20 nm to about 30 nm in other embodiments. The height H1 along the Z direction of the fin structure is in a range from about 100 nm to about 200 nm.

After the fin structure is formed, an insulating material layer 341 including one or more layers of insulating material is formed over the substrate so that the fin structures are fully embedded in the insulating layer 341. The insulating material for the insulating layer 341 includes silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. In some embodiments, an anneal operation is performed after the formation of the insulating layer 341. Then, a planarization operation, such as a chemical mechanical polishing (CMP) method and/or an etch-back method, is performed such that the upper surface of the uppermost second semiconductor layer 325 is exposed from the insulating material layer 341 as shown in FIG. 9.

Figure 9:
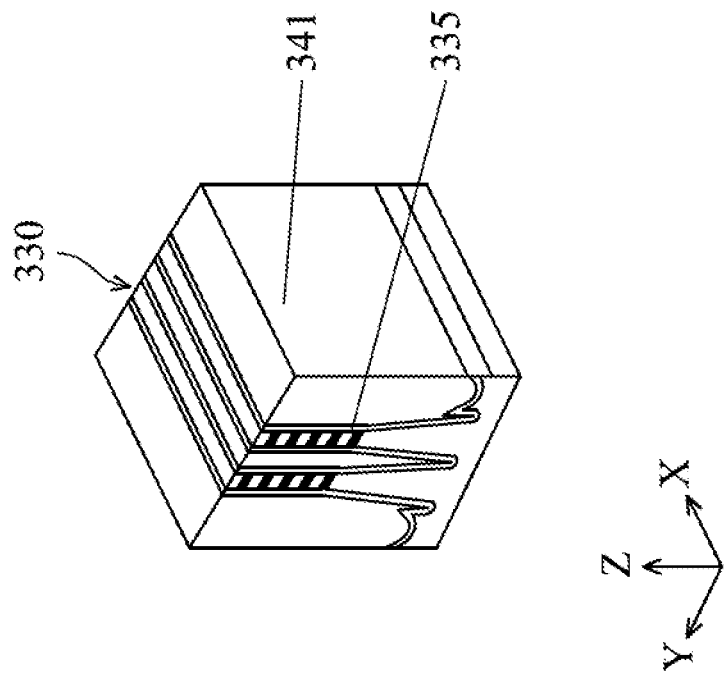

In some embodiments, a first liner layer 335 is formed over the structure of FIG. 8 before forming the insulating material layer 341, as shown FIG. 9. The first liner layer 335 is made of SiN or a silicon nitride-based material (e.g., SiON, SiCN or SiOCN).

Figure 10:
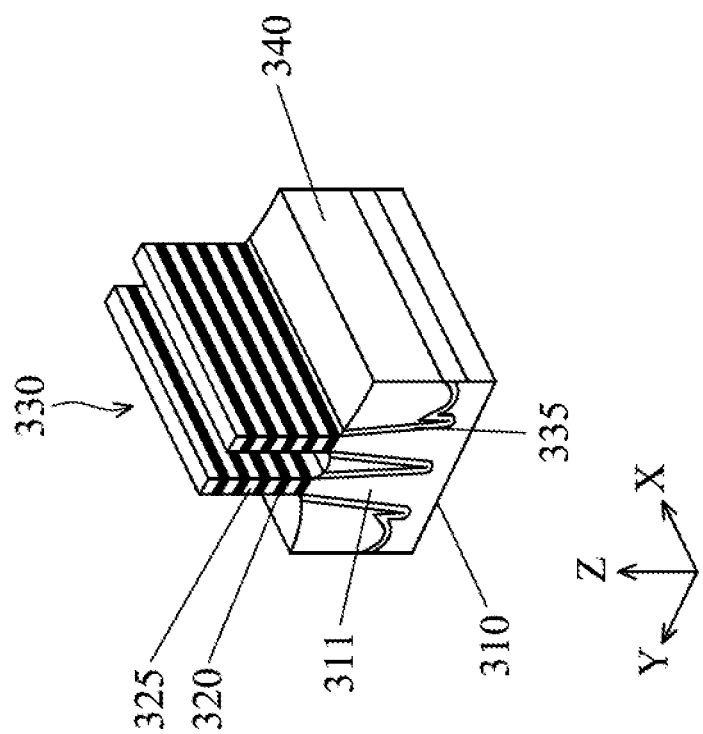

Then, as shown in FIG. 10, the insulating material layer 341 is recessed to form an isolation insulating layer 340 so that the upper portions of the fin structures 330 are exposed. With this operation, the fin structures 330 are electrically separated from each other by the isolation insulating layer 340, which is also called a shallow trench isolation (STI).

In the embodiment shown in FIG. 10, the insulating material layer 341 is recessed until the bottommost first semiconductor layer 320 is exposed. In other embodiments, the upper portion of the well layer 311 is also partially exposed. The first semiconductor layers 320 are sacrificial layers which are subsequently partially removed, and the second semiconductor layers 325 are subsequently formed into channel layers of a GAA FET.

Figure 11:
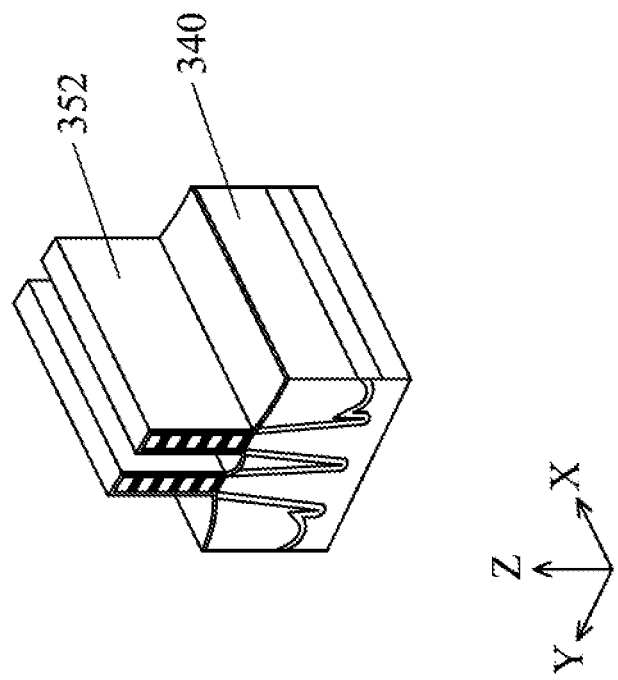

After the isolation insulating layer 340 is formed, a sacrificial gate dielectric layer 352 is formed, as shown in FIG. 11. The sacrificial gate dielectric layer 352 includes one or more layers of insulating material, such as a silicon oxide-based material. In one embodiment, silicon oxide formed by CVD is used. The thickness of the sacrificial gate dielectric layer 352 is in a range from about 1 nm to about 5 nm in some embodiments.

Figure 12:
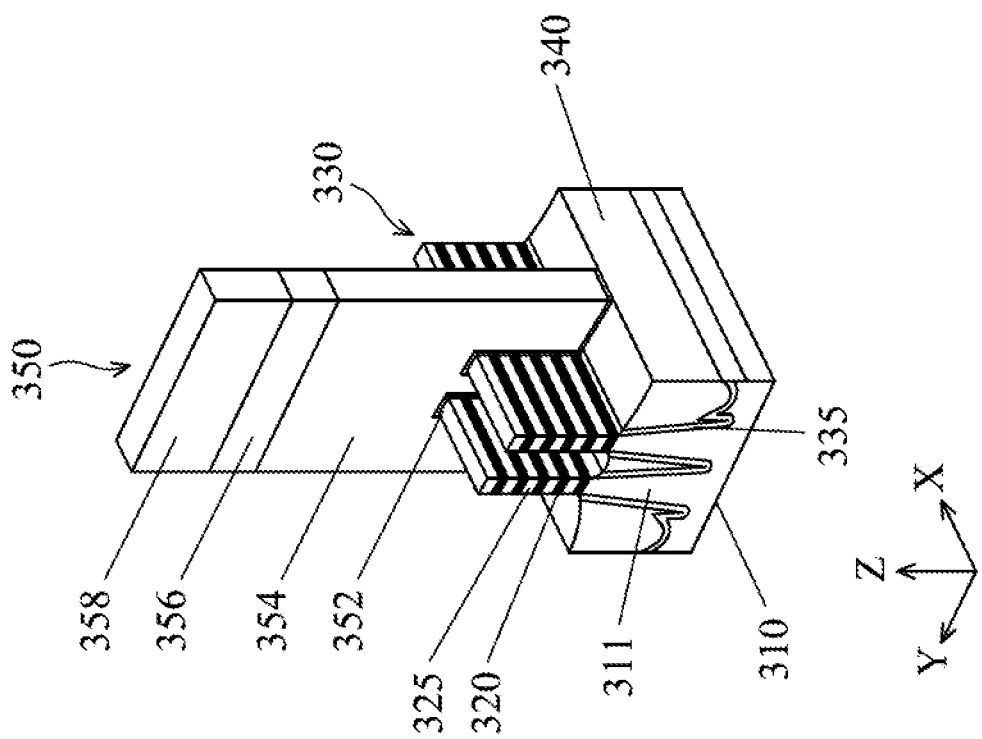

FIG. 12 illustrates a structure after a sacrificial gate structure 350 is formed over the exposed fin structures 330. The sacrificial gate structure includes a sacrificial gate electrode 354 and the sacrificial gate dielectric layer 352. The sacrificial gate structure 350 is formed over a portion of the fin structure which is to be a channel region. The sacrificial gate structure defines the channel region of the GAA FET.

The sacrificial gate structure 350 is formed by first blanket depositing the sacrificial gate dielectric layer 352 over the fin structures, as shown in FIG. 12. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 356 and a silicon oxide mask layer 358.

Next, a patterning operation is performed on the mask layer and sacrificial gate electrode layer is patterned into the sacrificial gate structure 350, as shown in FIG. 12. The sacrificial gate structure includes the sacrificial gate dielectric layer 352, the sacrificial gate electrode layer 354 (e.g., poly silicon), the pad SiN layer 356 and the silicon oxide mask layer 358. By patterning the sacrificial gate structure, the stacked layers of the first and second semiconductor layers are partially exposed on opposite sides of the sacrificial gate structure, thereby defining source/drain (S/D) regions, as shown in FIG. 12. In this disclosure, a source and a drain are interchangeably used and the structures thereof are substantially the same. In FIG. 12, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 13:
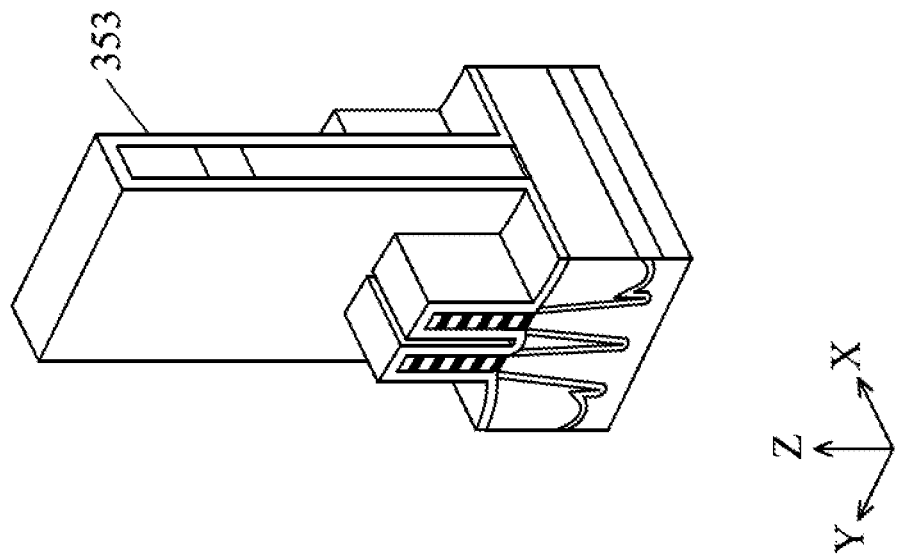

After the sacrificial gate structure is formed, a blanket layer 353 of an insulating material for sidewall spacers 355 is conformally formed by using CVD or other suitable methods, as shown in FIG. 13. The blanket layer 353 is deposited in a conformal manner so that it is formed to have substantially equal thicknesses on vertical surfaces, such as the sidewalls, horizontal surfaces, and the top of the sacrificial gate structure. In some embodiments, the blanket layer 353 is deposited to a thickness in a range from about 2 nm to about 10 nm. In one embodiment, the insulating material of the blanket layer 353 is a silicon nitride-based material, such as SiN, SiON, SiOCN or SiCN and combinations thereof.

Further, as shown in FIGS. 14A-14C, sidewall spacers 355 are formed on opposite sidewalls of the sacrificial gate structures, and subsequently, the fin structures of the S/D regions are recessed down below the upper surface of the isolation insulating layer 340. FIG. 14B is the cross sectional view corresponding to area A1 and line X1-X1 of FIG. 14A, and FIG. 14C is the cross sectional view corresponding to line Y1-Y1 of FIG. 14A. In FIG. 14B, the cross section of the bottom parts of one sacrificial gate structure 350 and an adjacent sacrificial gate structure 350' are illustrated.

After the blanket layer 353 is formed, anisotropic etching is performed on the blanket layer 353 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. In some embodiments, the mask layer 358 is exposed from the sidewall spacers. In some embodiments, isotropic etching is subsequently performed to remove the insulating material from the upper portions of the S/D region of the exposed fin structures 330.

Subsequently, the fin structures of the S/D regions are recessed down below the upper surface of the isolation insulating layer 340, by using dry etching and/or wet etching. As shown in FIGS. 14A and 14C, the sidewall spacers 355 formed on the S/D regions of the exposed fin structures partially remain. In other embodiments, however, the sidewall spacers 355 formed on the S/D regions of the exposed fin structures are fully removed. At this stage, end portions of the stacked layer of the first and second semiconductor layers 320, 325 under the sacrificial gate structure have substantially flat faces which are flush with the sidewall spacers 355, as shown in FIG. 14B. In some embodiments, the end portions of the stacked layer of the first and second semiconductor layers 320, 325 are slightly horizontally etched.

Subsequently, as shown in FIGS. 15A-15C, the first semiconductor layers 320 are horizontally recessed (etched) so that edges of the first semiconductor layers 320 are located substantially below a side face of the sacrificial gate electrode layer 54. As shown in FIG. 15B, end portions (edges) of the first semiconductor layers 320 under the sacrificial gate structure are substantially flush with the side faces of the sacrificial gate electrode layer 354. Here, "being substantially flush" means the difference in the relative position is less than about 1 nm.

During the recess etching of the first semiconductor layers 320 and/or the recess etching of the first and second semiconductor layers as described with FIGS. 15A-15C, end portions of the second semiconductor layers 325 are also horizontally etched, as shown in FIG. 15B. The recessed amount of the first semiconductor layers 320 is greater than the recessed amount of the second semiconductor layers 325.

The depth D1 of the recessing of the first semiconductor layers 320 from the plane including one sidewall spacer is in a range from about 5 nm to about 10 nm, the depth D2 of the recessing of the second semiconductor layers 325 from the plane including one sidewall spacer is in a range from about 1 nm to about 4 nm, in some embodiments. The difference D3 of the depth D1 and the depth D2 is in a range from about 1 nm to about 9 nm, in some embodiments.

In certain embodiments, the etching (horizontally recessing) the first and second semiconductor layers is not performed. In other embodiments, the amounts of etching of the first and second semiconductor layers are substantially the same (difference is less than about 0.5 nm).

After the first semiconductor layers 320 are horizontally recessed, a liner epitaxial layer 370 is formed on the recessed surfaces of the first and second semiconductor layers 320, 325, as shown in FIGS. 16A-16C. The liner epitaxial layer 370 is also formed on the recessed fin structure 311 at the S/D regions.

In some embodiments, the liner epitaxial layer 370 is undoped silicon. In other embodiments, the liner epitaxial layer includes one or more layers of Si, SiP and SiCP. In certain embodiments, the liner epitaxial layer 370 is made of one or more layers of SiGe and Ge. The thickness of the liner epitaxial layer 70 on the recessed surface of the first semiconductor layers 320 is in a range from about 5 nm to about 10 nm, in some embodiments. The thickness of the liner epitaxial layer 370 on the recessed surface of the second semiconductor layers 325 is in a range from about 1 nm to about 4 nm, in some embodiments. The thickness of the liner epitaxial layer 370 on the recessed surface of the second semiconductor layers 325 is about 20% to about 60% of the thickness of the liner epitaxial layer 370 on the recessed surface of the first semiconductor layers 320, in certain embodiments. The liner epitaxial layer 370 is selectively grown on the semiconductor layers.

Figure 17:
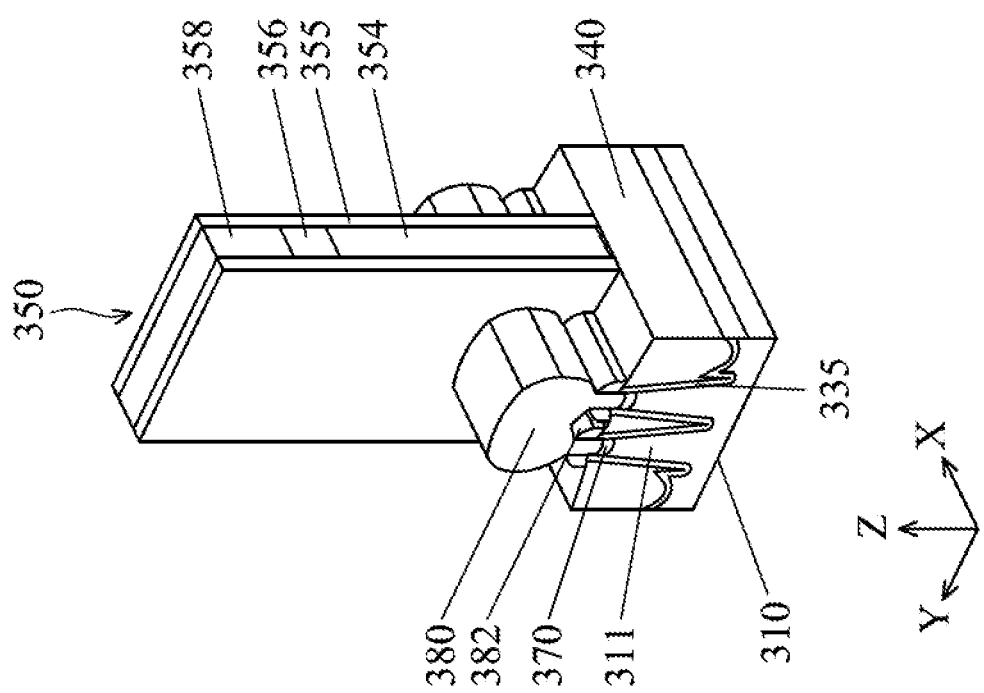

After the liner epitaxial layer 370 is formed, source/drain (S/D) epitaxial layers 380 are formed, as shown in FIG. 17. The S/D epitaxial layer 380 includes one or more layers of Si, SiP, SiC and SiCP for an n-channel FET or Si, SiGe, Ge for a p-channel FET. The S/D layers 380 are formed by an epitaxial growth method using CVD, ALD or molecular beam epitaxy (MBE).

As shown in FIG. 17, the S/D epitaxial layers grow from the liner layers 370 formed on respective surfaces of bottoms 311 of two fin structures. The grown epitaxial layers merge above the isolation insulating layer and form a void 382 in some embodiments.

Figure 18:
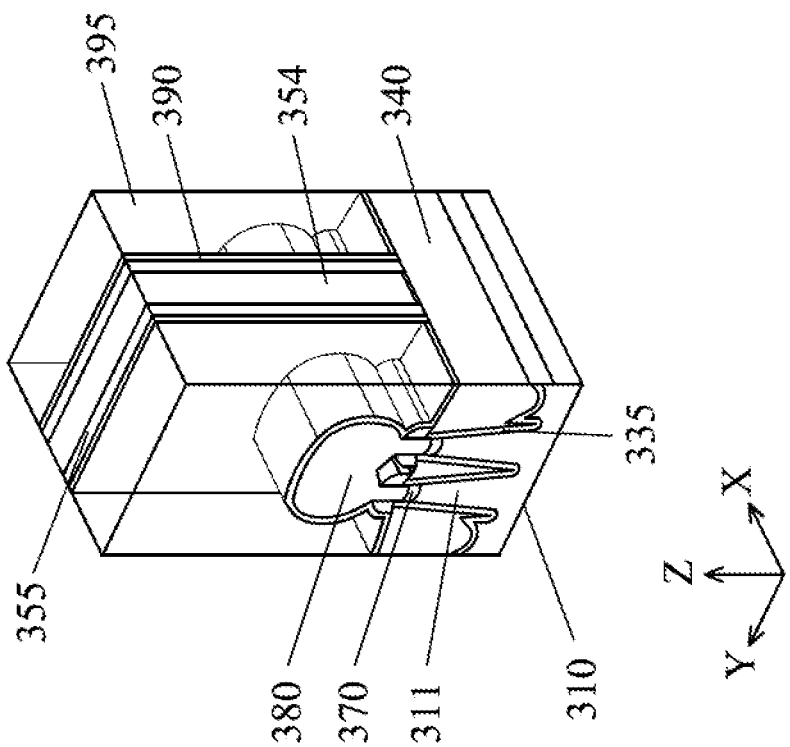

Subsequently, a second liner layer 390 is formed and then an interlayer dielectric (ILD) layer 395 is formed, as shown in FIG. 18. The second liner layer 390 is made of a silicon nitride-based material, such as SiN, and functions as a contact etch stop layer in the subsequent etching operations.

The materials for the ILD layer 395 include compounds having Si, O, C and/or H, such as silicon oxide, SiCOH and SiOC. Organic materials, such as polymers, is used for the ILD layer 395. After the ILD layer 395 is formed, a planarization operation, such as CMP, is performed, so that the top portion of the sacrificial gate electrode layer 354 is exposed.

Figure 19:
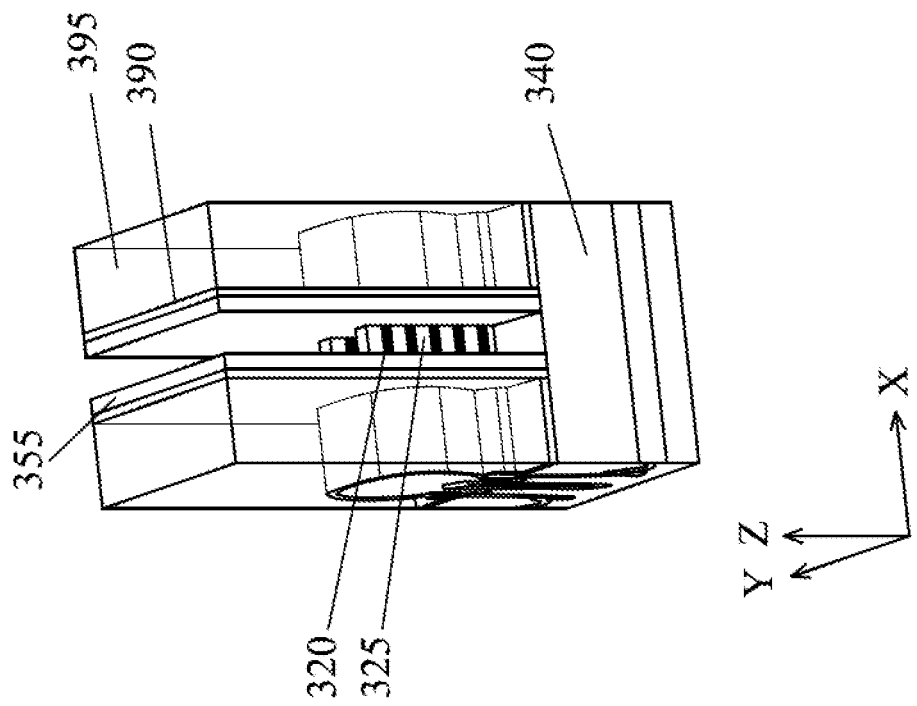

Next, as shown in FIG. 19, the sacrificial gate electrode layer 354 and sacrificial gate dielectric layer 352 are removed, thereby exposing the fin structures. The ILD layer 395 protects the S/D structures 380 during the removal of the sacrificial gate structures. The sacrificial gate structures can be removed using plasma dry etching and/or wet etching. When the sacrificial gate electrode layer 354 is polysilicon and the ILD layer 395 is silicon oxide, a wet etchant such as a TMAH solution can be used to selectively remove the sacrificial gate electrode layer 354. The sacrificial gate dielectric layer 352 is thereafter removed using plasma dry etching and/or wet etching.

Figure 20B:
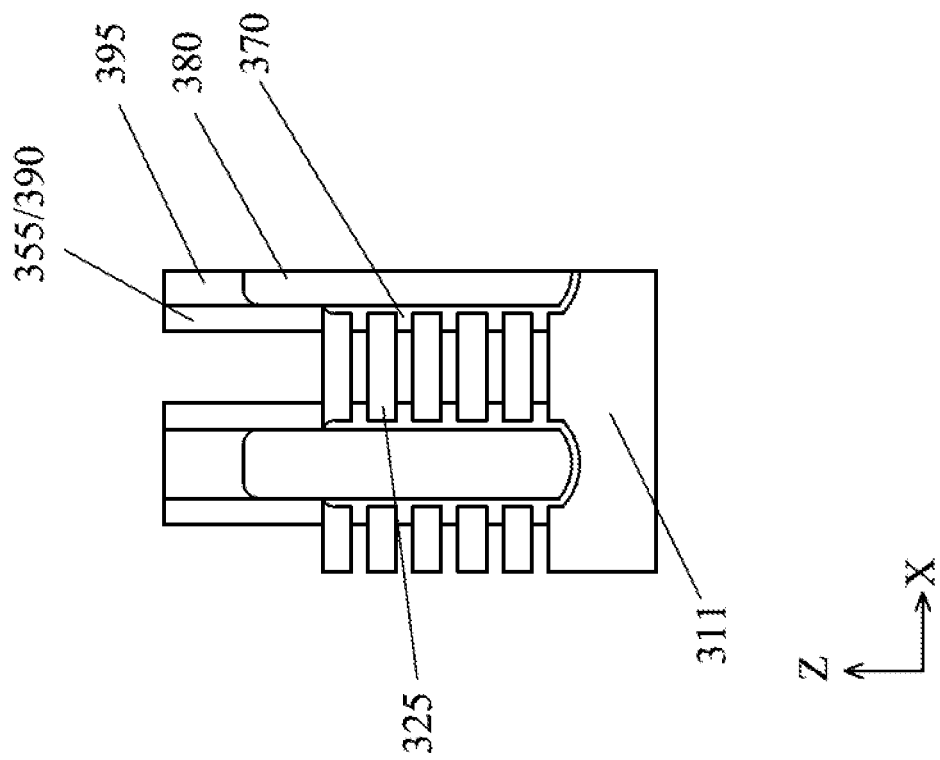
Figure 20A:
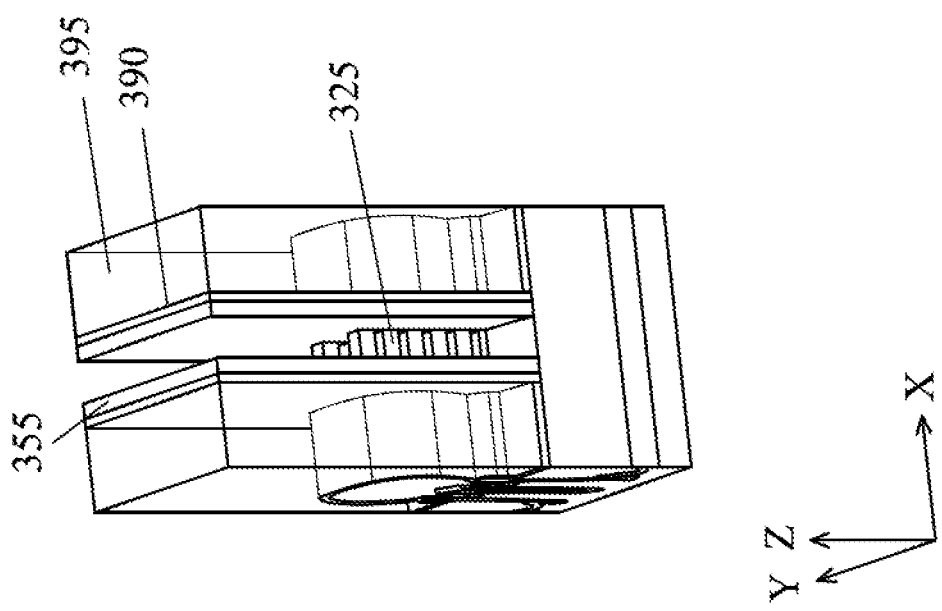

After the sacrificial gate structures are removed, the first semiconductor layers 320 in the fin structures are removed, thereby forming wires of the second semiconductor layers 325, as shown in FIGS. 20A and 20B. FIG. 20B is the cross sectional view along the fin structure.

The first semiconductor layers 320 can be removed or etched using an etchant that can selectively etch the first semiconductor layers 320 against the second semiconductor layers 325. When the first semiconductor layers 320 are Ge or SiGe and the second semiconductor layers 325 are Si, the first semiconductor layers 320 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

When the first semiconductor layers 320 are Si and the second semiconductor layers 325 are Ge or SiGe, the first semiconductor layers 320 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

In the present embodiment, since the liner epitaxial layer 370 (e.g., Si) is formed, the etching of the first semiconductor layers 320 (e.g., SiGe) stops at the liner epitaxial layer 370. When the first semiconductor layers 320 are made of Si, the liner epitaxial layer 370 can be SiGe or Ge. Since the etching of the first semiconductor layers 320 stop at the liner epitaxial layer 370, it is possible to prevent the gate electrode and the S/D epitaxial layer from contacting or bridging.

Figures 21, 22:
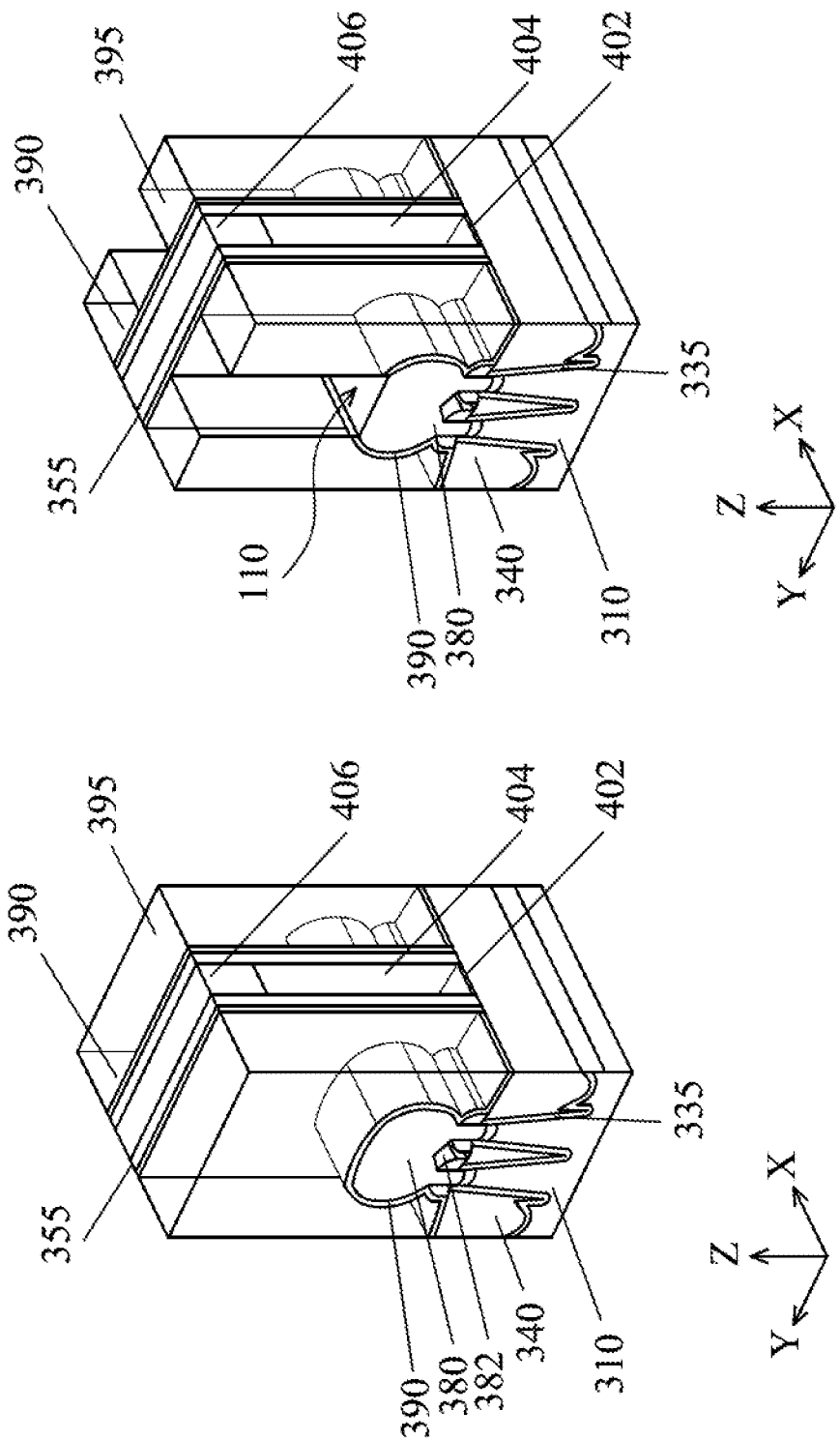

After the wires of the second semiconductor layers 325 are formed, a gate dielectric layer 402 is formed around each channel layers (wires of the second semiconductor layers 325), and a gate electrode layer 404 is formed on the gate dielectric layer 402, as shown in FIG. 21.

In certain embodiments, the gate dielectric layer 402 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 402 includes an interfacial layer formed between the channel layers and the dielectric material.

The gate dielectric layer 402 is formed by CVD, ALD or any suitable method. In one embodiment, the gate dielectric layer 402 is formed using a highly conformal deposition process such as ALD in order to ensure the formation of a gate dielectric layer having a uniform thickness around each channel layers. The thickness of the gate dielectric layer 402 is in a range from about 1 nm to about 6 nm in one embodiment.

The gate electrode layer 404 is formed on the gate dielectric layer 402 to surround each channel layers. The gate electrode 404 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 404 is formed by CVD, ALD, electro-plating, or other suitable method. The gate electrode layer is also deposited over the upper surface of the ILD layer 395. The gate dielectric layer and the gate electrode layer formed over the ILD layer 395 are then planarized by using, for example, CMP, until the top surface of the ILD layer 395 is revealed.

After the planarization operation, the gate electrode layer 404 is recessed and a cap insulating layer 406 is formed over the recessed gate electrode 404, as shown in FIG. 22. The cap insulating layer includes one or more layers of a silicon nitride-based material, such as SiN. The cap insulating layer 406 can be formed by depositing an insulating material followed by a planarization operation.

In certain embodiments of the present disclosure, one or more work function adjustment layers (not shown) are interposed between the gate dielectric layer 402 and the gate electrode 404. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer is formed by ALD, PVD, CVD, e-beam evaporation, or other suitable process. Further, the work function adjustment layer is formed separately for the n-channel FET and the p-channel FET which use different metal layers.

Figures 23, 24:
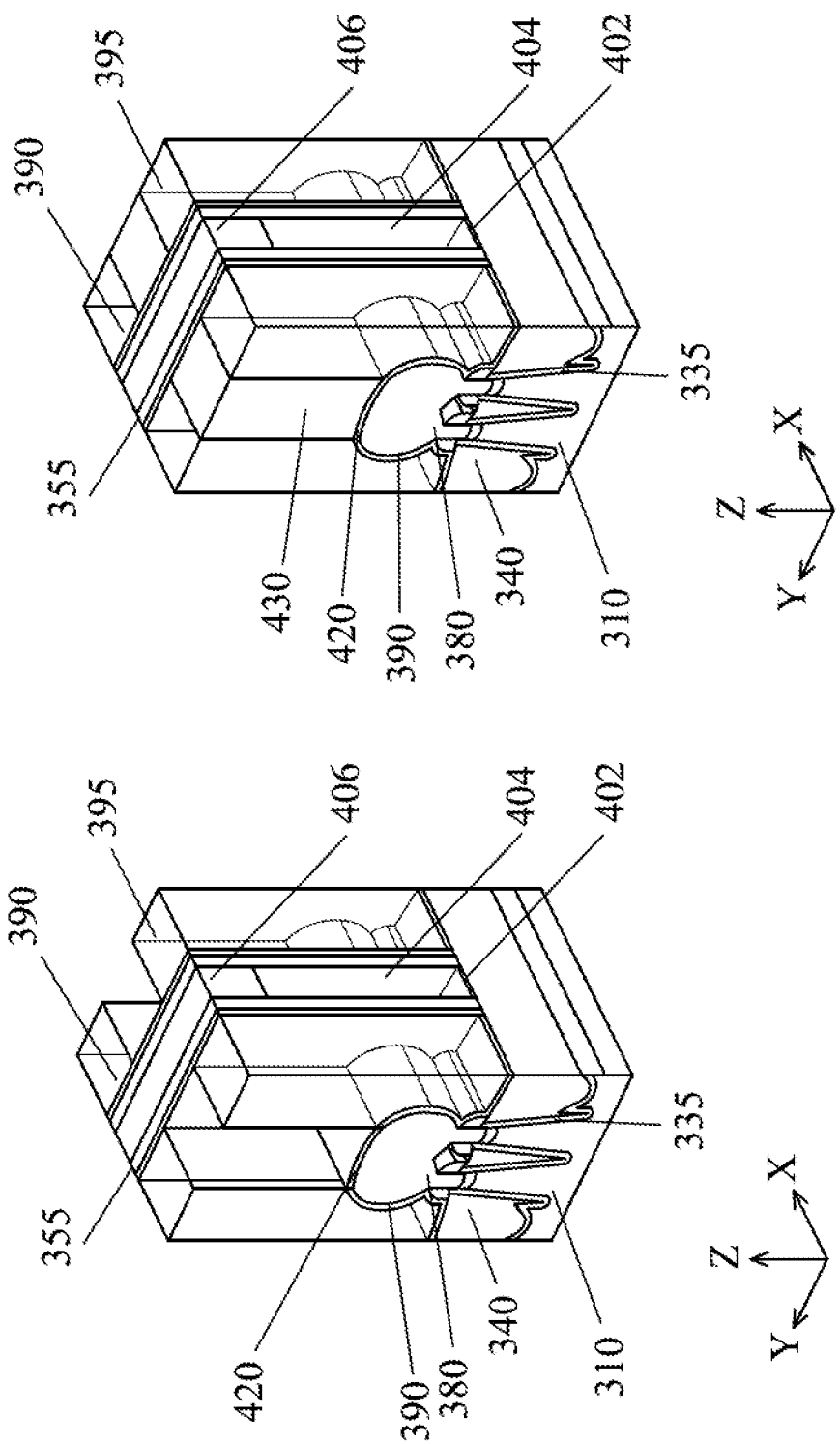

Subsequently, contact holes 410 are formed in the ILD layer 395 by using dry etching, as shown in FIG. 22. A silicide layer 420 is formed over the S/D epitaxial layer 380, as shown in FIG. 23. The silicide layer includes one or more of WSi, CoSi, NiSi, TiSi, MoSi and TaSi. Then, a conductive material 430 is formed in the contact holes as shown in FIG. 24. The conductive material 430 includes one or more of Co, Ni. W, Ti, Ta, Cu, Al, TiN and TaN.

Figure 25C:
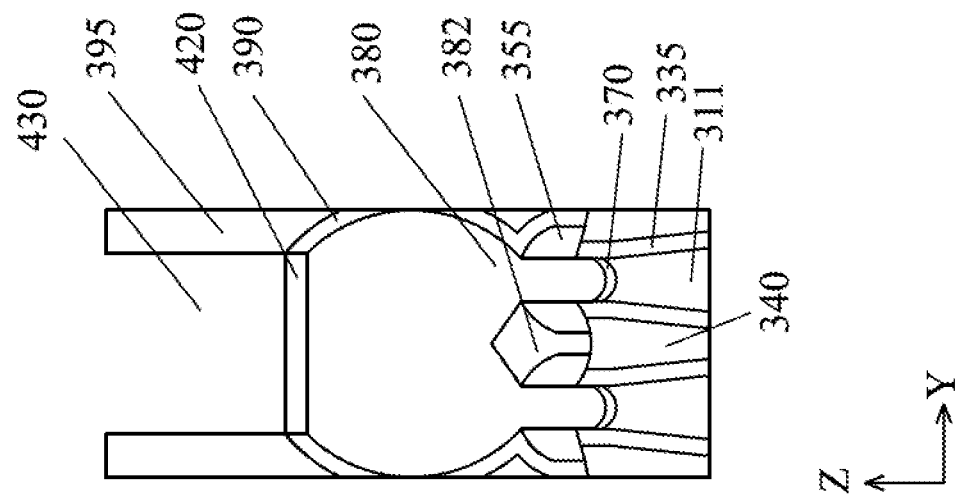
Figure 25B:
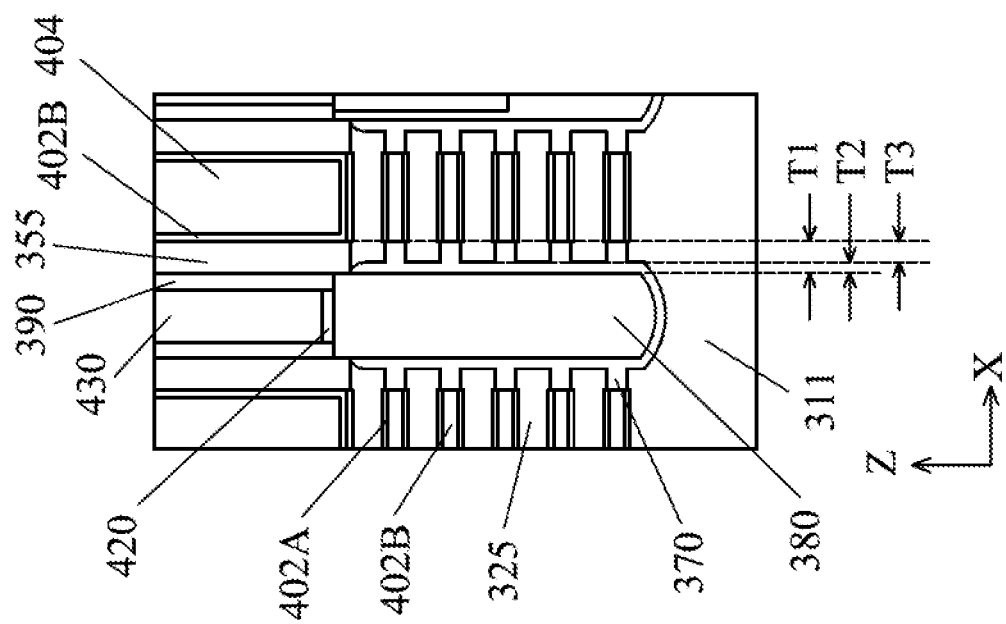
Figure 25A:
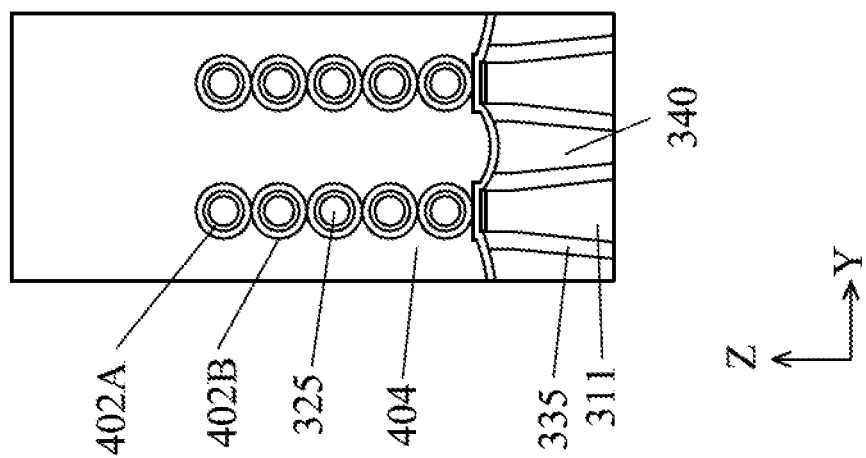

FIGS. 25A-25C show cross sectional views of the structure of FIG. 24. FIG. 25A shows the cross sectional view cutting the gates along the Y direction, FIG. 25B shows the cross sectional view cutting the gates along the X direction and FIG. 25C shows the cross sectional view cutting the S/D region along the Y direction.

As shown in FIG. 25A, the wires made of the second semiconductor layer 325 are stacked in the Z direction. It is noted that the second semiconductor layers 325 are also etched when the first semiconductor layer 320 are removed, and thus the corners of the second semiconductor layers 325 are rounded. An interfacial layer 402A wraps around each of the wires, and the gate dielectric layer 402B covers the interfacial layer 402A. Although the gate dielectric layer 420B wrapping around one wire is in contact with that of the adjacent wire in FIG. 25A, the structure is not limited to FIG. 25A. In other embodiments, the gate electrode 404 also wraps around each of the wires covered by the interfacial layer 402A and the gate dielectric layer 402B.

As shown in FIG. 25B, the liner epitaxial layer 370 is formed between the S/D epitaxial layer 380 and the wires (second semiconductor layers 325). The thickness T1 of the liner epitaxial layer 370 at the portion between the wires is in a range from about 5 nm to about 10 nm, the thickness T2 of the recessing of the liner epitaxial layer 370 at the ends of the wires is in a range from about 1 nm to about 4 nm, in some embodiments. The difference T3 of the thickness T1 and the thickness T2 is in a range from about 1 nm to about 9 nm, in some embodiments. The thickness T2 is about 20% to about 60% of the thickness T1 in certain embodiments, and is about less than 40% in other embodiments.

It is understood that the GAA FETs undergoes further CMOS processes to form various features such as contacts/vias, interconnect metal layers, dielectric layers, passivation layers, etc.

Figure 26:
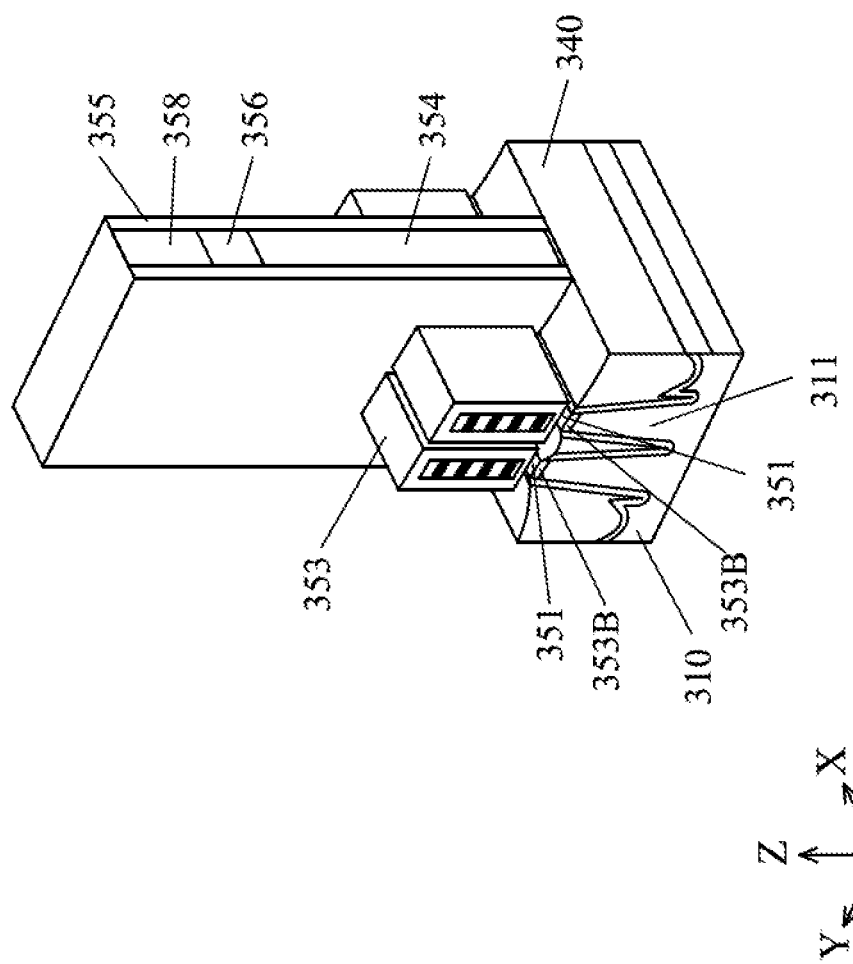
FIG. 26 is a perspective view illustrating an intermediate step for forming the GAA FET device, in accordance with some embodiments of the disclosure.

Then, as shown in FIG. 26, a portion of the first semiconductor layers 320 and/or the second semiconductor layers 325 is removed to form an air gap 351. To be more specific, the remaining the first semiconductor layers 320 and the second semiconductor layers 325 are wrapped by the blanket layer 353, and the air gap 351 is located between the fin structure 311 and the semiconductor layers 320, 325. A bottom spacer 353B is formed on the 311 and aligned with the blanket layer 353. The air gap 351 is configured to cut off the leakage path. The bottom spacer 353B is configured to serve as an etch stop layer for subsequent process.

Figure 27A:
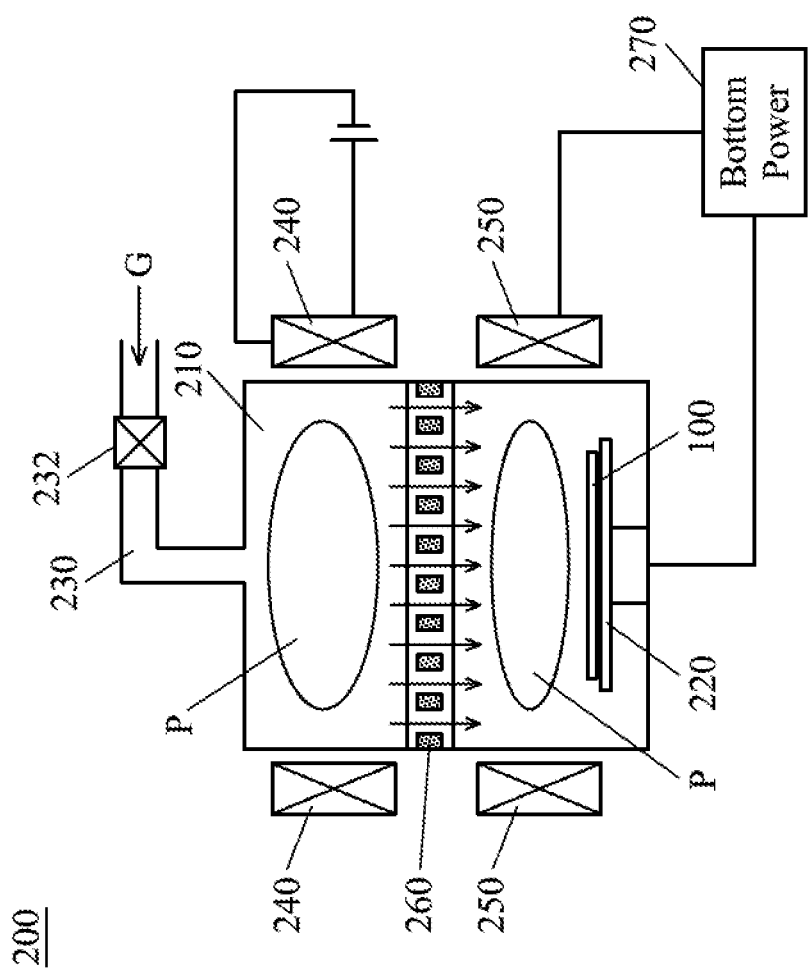
FIGS. 27A, 28A, and 29A are cross-sectional views illustrating a processing apparatus for forming a semiconductor structure, in accordance with some embodiments of the disclosure.
Figure 27C:
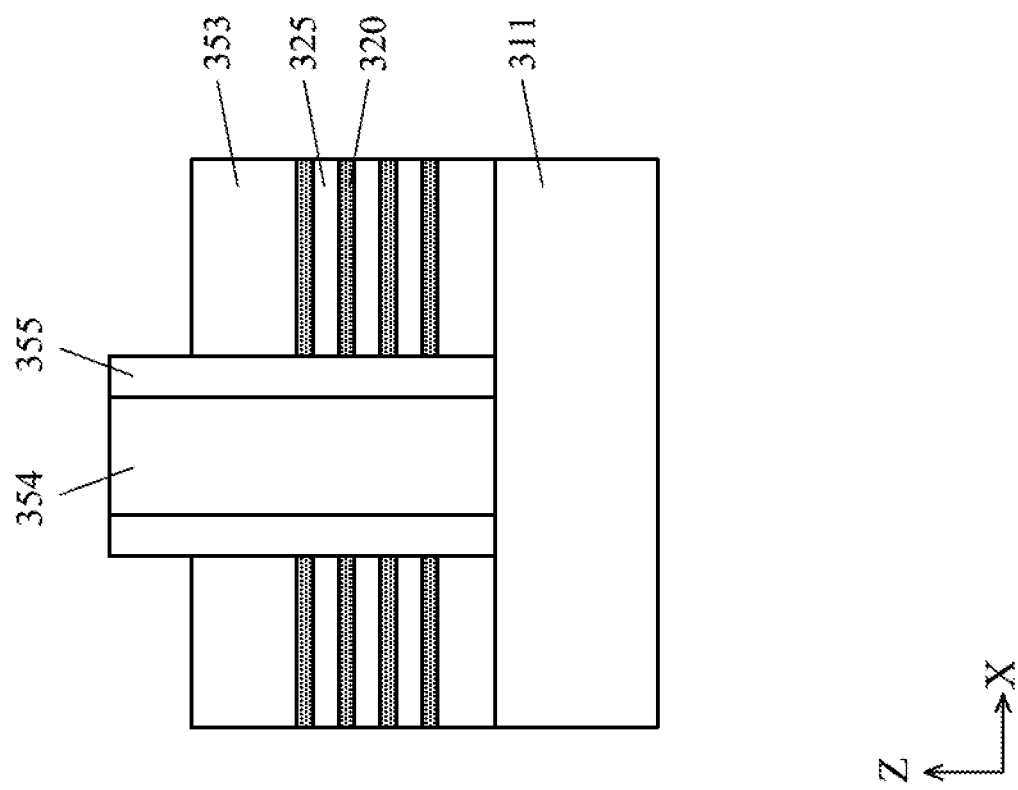
FIGS. 27B, 27C, 28B, 28C, 29B, and 29C are cross-sectional views illustrating a semiconductor structure, in accordance with some embodiments of the disclosure.
Figure 27B:
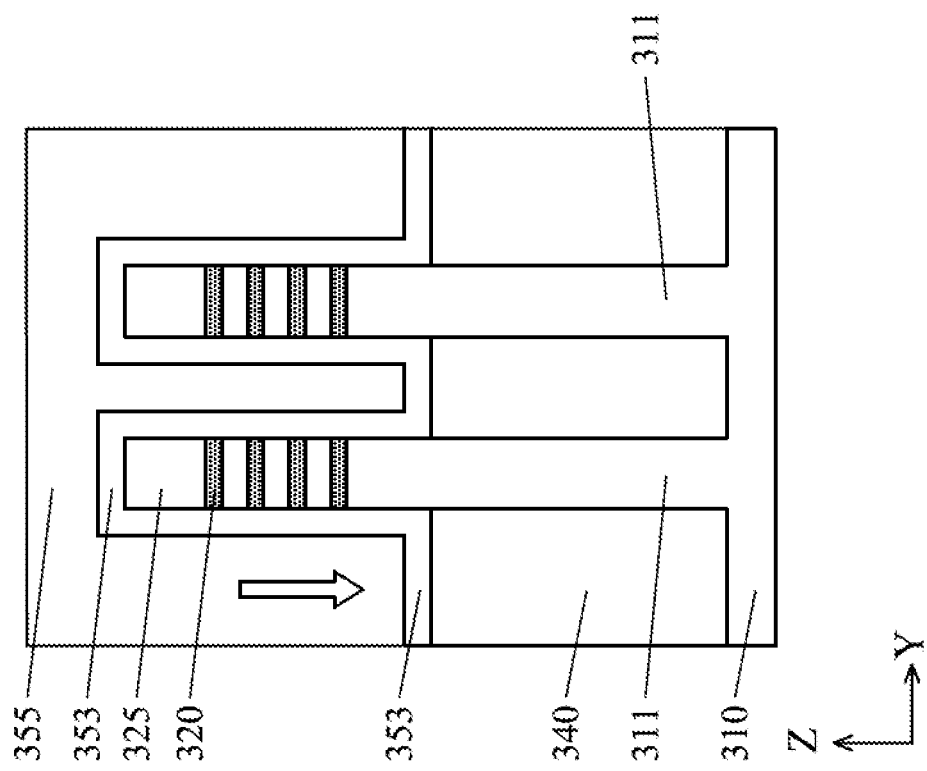

FIG. 27A is a cross-sectional view illustrating the processing apparatus 200 for forming a semiconductor structure, in accordance with some embodiments of the disclosure. For example, the substrate 100 includes a semiconductor structure as shown in FIG. 13, but it is not limited thereto. FIGS. 27B and 27C are cross-sectional views illustrating a semiconductor structure, in accordance with some embodiments of the disclosure. FIG. 27B shows the cross-sectional view cutting the semiconductor structure as shown in FIG. 13 along the Y direction, FIG. 27C shows the cross-sectional view cutting the semiconductor structure as shown in FIG. 13 along the X direction. For example, the processing apparatus 200 is configured to perform an etching process to the semiconductor structure. The detailed description for the operation of the processing apparatus 200 and the corresponding semiconductor structure is provided as follows.

As shown in FIG. 27A, the first coil 240 is turned on (i.e. electrically connected to a power source). The processing apparatus 200 further includes a power source 270 electrically connected to the second coil 250 and the bottom electrode (not shown) in the carrier 220. In some embodiments, the power source 270 supplies synchronic pulse to the second coil 250 and the bottom electrode. In some embodiments, the power source 270 supplies asynchronous pulse to the second coil 250 and the bottom electrode.

The process gas G enters the chamber 210 and is transformed into the plasma P by the first coil 240 (which is turned on at this stage). Then, the plasma P passes through the filter 260. Since the filter 260 is grounded, ions, electrons and other charged particles in the plasma P are intercepted by the filter 260. Therefore, the remaining radicals in the plasma P flow downward (i.e. toward the substrate 100). In addition, another plasma P is also generated by the second coil 250 and the bottom electrode. As such, a plasma assisted chemical etching (PACE) process is performed to the semiconductor structure on the substrate 100. Meanwhile, as shown in FIGS. 27B and 27C, the blanket layer 353 on the isolation insulating layer 340 is going to be etched and removed (shown as the arrows in FIG. 27B).

For example, in the embodiment shown in FIG. 27A, the process gas G includes $NF_3$, $NH_3$, He, or any other suitable gas. In some embodiments, the process gas G is supplied in a range from about 10 sccm to 1000 sccm. The pressure of the chamber 210 is under about 10 Torr to about 20 Torr. In some embodiments, the power of the first coil 240 is in a range from about 10 W to about 50 W. In some embodiments, the power of the second coil 250 is in a range from about 10 W to about 50 W. The voltage of the bias applied to the bottom electrode is in a range from about 100V to about 500V. The frequency of the applied pulse is in a range from about 50 Hz to about 500 Hz, and the duty cycle of the applied pulse is in a range from about 10% to about 30%.

Figure 28A:
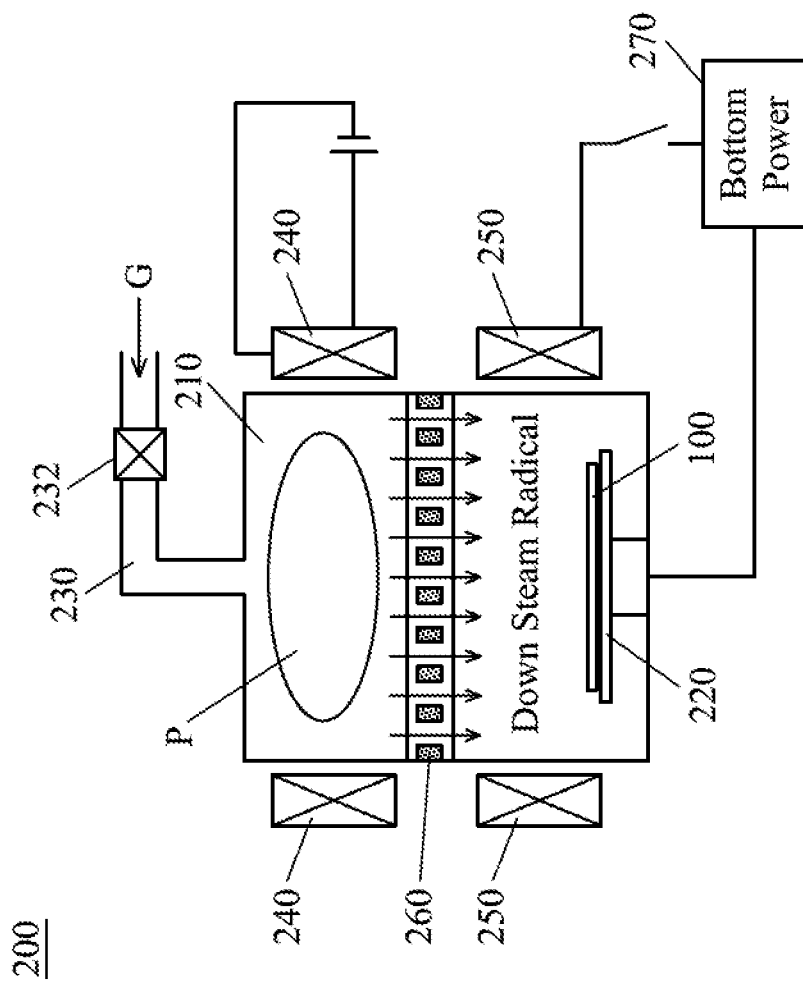
Figure 28C:
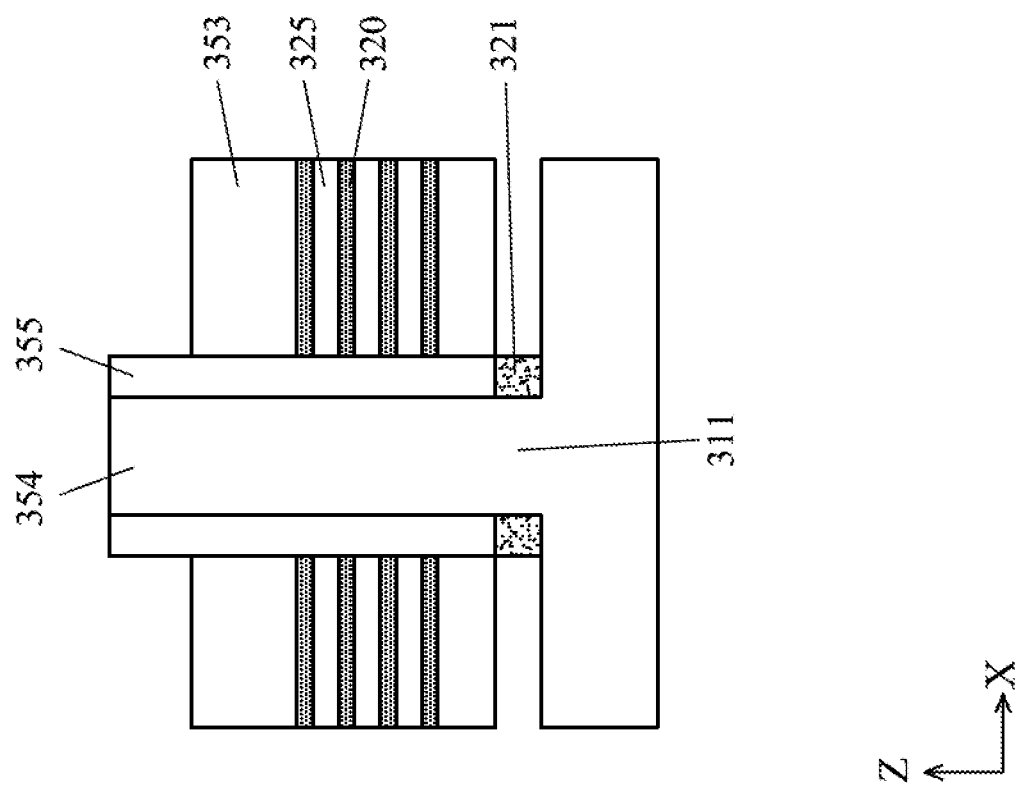
Figure 28B:
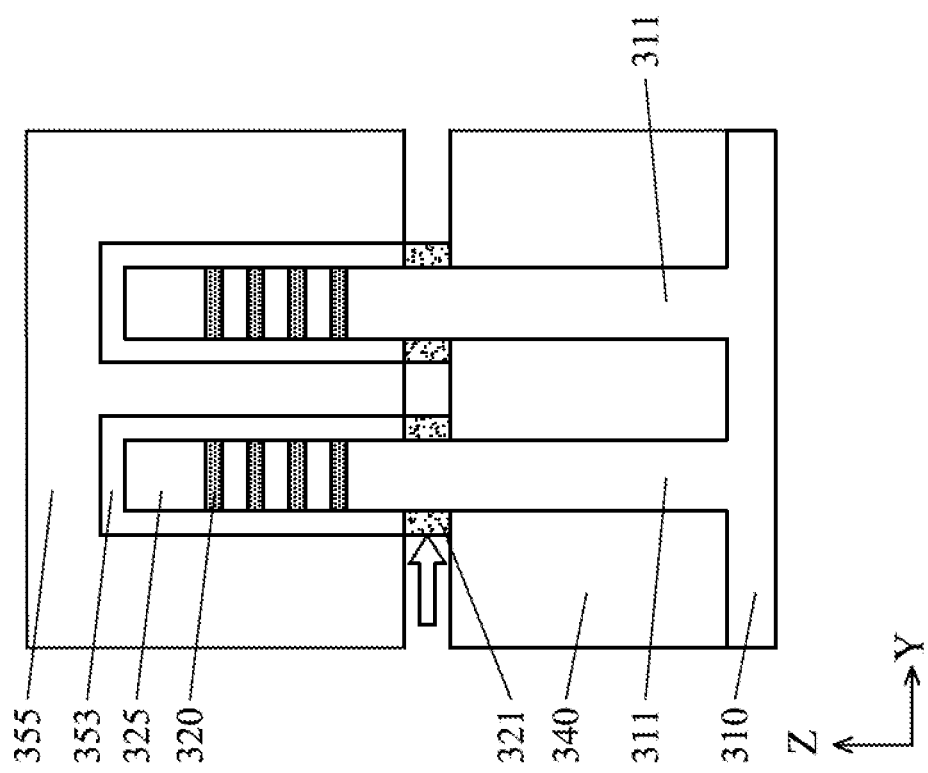

FIG. 28A is a cross-sectional view illustrating the processing apparatus 200 for forming a semiconductor structure, in accordance with some embodiments of the disclosure. FIG. 28B is a cross-sectional view illustrating a semiconductor structure, in accordance with some embodiments of the disclosure. After the above PACE process is performed, the first coil 240 is kept on and the second coil 250 is turned off for performing a chemical etching process. Since the principle of operation at this stage is similar to that shown in FIG. 2A, the detailed description is not repeated for the sake of brevity. Meanwhile, as shown in FIGS. 28B and 28C, the lateral insulating layer 321 is going to be etched and removed (shown as the arrows in FIG. 28B).

For example, in the embodiment shown in FIG. 28A, the process gas G includes $NF_3$, $NH_3$, He, or any other suitable gas. In some embodiments, the process gas G is supplied in a range from about 100 sccm to 1000 sccm. The pressure of the chamber 210 is under about 10 Torr to about 20 Torr. In some embodiments, the power of the first coil 240 is in a range from about 10 W to about 50 W.

Figure 29A:
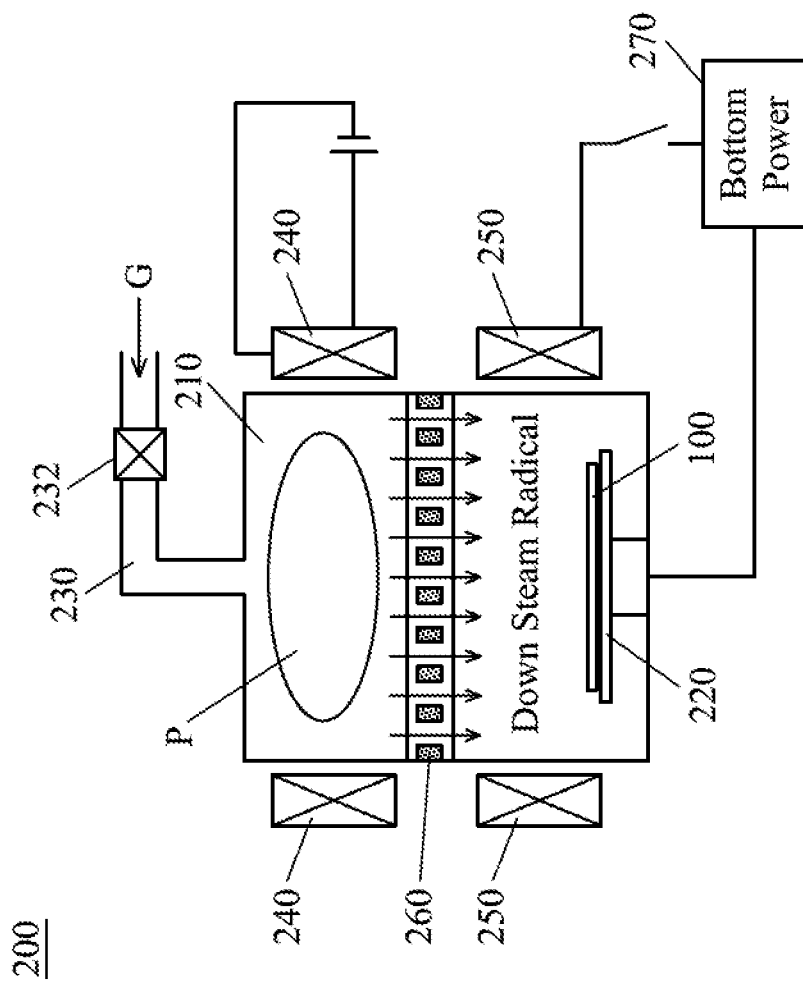
Figure 29C:
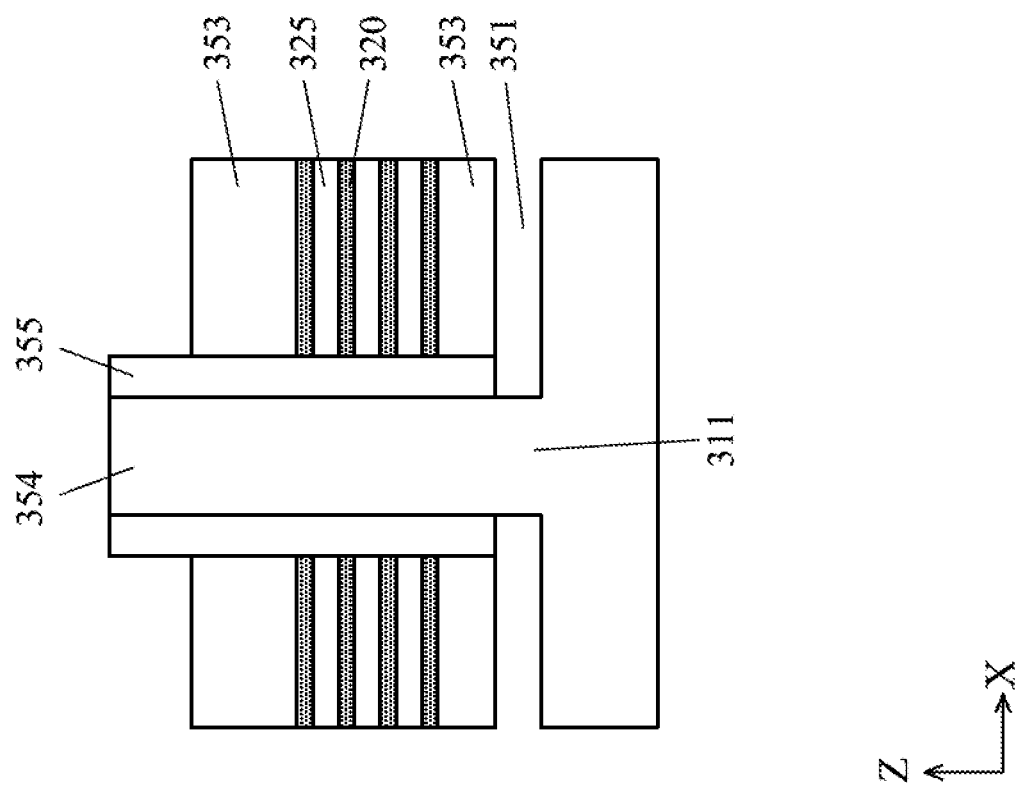
Figure 29B:
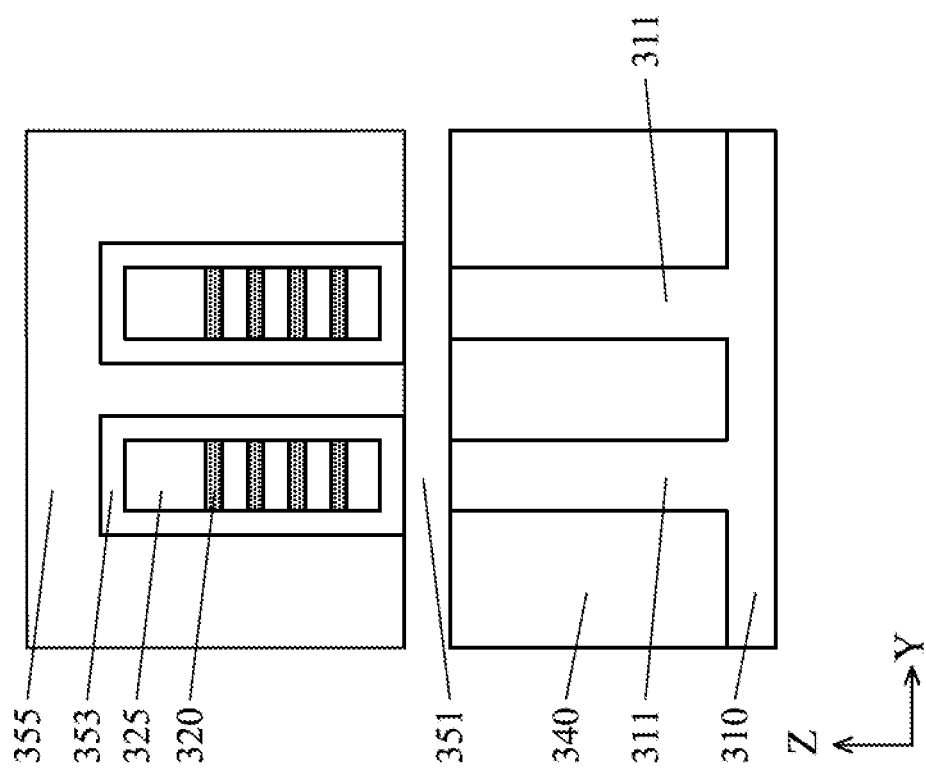

FIG. 29A is a cross-sectional view illustrating the processing apparatus 200 for forming a semiconductor structure, in accordance with some embodiments of the disclosure. FIG. 29B is a cross-sectional view illustrating a semiconductor structure, in accordance with some embodiments of the disclosure. After the above chemical process is performed, the first coil 240 is kept on and the second coil 250 is kept off for performing another chemical etching process. Since the principle of operation at this stage is similar to that shown in FIG. 2A, the detailed description is not repeated for the sake of brevity. Meanwhile, as shown in FIGS. 29B and 29C, at least a portion of the first semiconductor layers 320 and/or the second semiconductor layers 325 is removed (shown as the arrows in FIG. 29B) and the air gap 351 is formed.

For example, in the embodiment shown in FIG. 29A, the process gas G includes $NF_3$, $H_2$, He, or any other suitable gas. In some embodiments, the process gas G is supplied in a range from about 100 sccm to 10000 sccm. The pressure of the chamber 210 is under about 0.5 Torr to about 5 Torr. In some embodiments, the power of the first coil 240 is in a range from about 100 W to about 500 W.

Embodiments of a processing apparatus and method for forming semiconductor structure are provided. The processing apparatus may include a chamber, a first coil, a second coil. The first coil and the second coil around the chamber transform the process gas into plasma, and a grounded filter may guide some of the plasma to switch different types of etching processes performed by the processing apparatus. By means of switching on and off or moving the coils, different etching processes are performed in-situ in single processing apparatus. Accordingly, the required time and cost for forming semiconductor structure may be reduced. In addition, better process controllability and flexibility are obtained. The interfacial oxidation issues due to process changes between different tools are avoided.

In some embodiments, a processing apparatus is provided. The processing apparatus includes a chamber and a carrier that is positioned in the chamber for holding a substrate. The processing apparatus further includes a gas inlet connected to the chamber. The gas inlet is configured to supply a process gas into the chamber. The processing apparatus also includes a coil module positioned around the chamber and configured to transfer the process gas into plasma. In addition, the processing apparatus includes a filter disposed in the chamber. The coil module is configured to change a position of the plasma between a first position and a second position, the first position is located between the gas inlet and the filter, and the second position is located between the filter and the carrier.

In some embodiments, a method for forming a semiconductor structure is provided. The method includes transferring a substrate onto a carrier in a chamber and supplying a process gas via a gas inlet into the chamber. The method also includes turning on a coil module around the chamber to generate plasma in the chamber. The method further includes changing a position of the plasma between a first position and a second position, the first position is located between the gas inlet and a filter, and the second position is located between the filter and the carrier. In addition, the method includes etching the substrate by using the plasma generated in the chamber.

In some embodiments, a method for forming a semiconductor structure is provided. The method includes providing a first coil and a second coil around a chamber and transferring a substrate onto a carrier in the chamber. The method also includes supplying a process gas via a gas inlet into the chamber and turning on the first coil to transform the process gas into plasma. The method further includes turning off the second coil when the first coil is turned on. In addition, the method includes etching the substrate by using the plasma generated in the chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    transferring a semiconductor substrate onto a carrier in a chamber;
    supplying a process gas via a gas inlet into the chamber;
    turning on a first coil of a coil module continuously for a period of time around a first position of the chamber to generate first plasma at the first position in the chamber, wherein the first position is located between the gas inlet and a filter;
    turning on a second coil of the coil module around a second position of the chamber to generate second plasma at the second position, wherein the second position is located between the filter and the carrier, wherein the second plasma is generated at the second position when the first plasma is generated at the first position; and
    after generating the second plasma at the second position, turning off the second coil, wherein the second coil is turned on and turned off during the period of time.

2. The method as claimed in claim 1, wherein generating the first plasma by turning on the first coil of the coil module further comprises:
   positioning the first coil of the coil module between the gas inlet and the filter; and
   grounding the filter for intercepting charged particles in the first plasma by the filter.

3. The method as claimed in claim 1, wherein the process gas comprises $NF_3$, $NH_3$, He, $H_2$, $Cl_2$, Ar, or HBr.

4. The method as claimed in claim 1, wherein a duty cycle of the supplied pulse is in a range from about 10% to about 30%.

5. The method as claimed in claim 1, wherein generating the second plasma further comprises:
   supplying a pulse to the coil module and a bottom electrode in the carrier by a power source.

6. The method as claimed in claim 5, wherein the power source supplies synchronic pulse to the second coil and the bottom electrode.

7. The method as claimed in claim 5, wherein the power source supplies asynchronous pulse to the second coil and the bottom electrode.

8. A method for forming a semiconductor structure, comprising:
   providing a first coil and a second coil around a chamber, wherein the first coil is located between a gas inlet and a filter, and the second coil is located between the filter and a carrier;
   transferring a semiconductor substrate onto the carrier in the chamber;
   supplying a process gas via the gas inlet into the chamber;
   turning on the first coil to transform the process gas into plasma;
   turning on the second coil after the first coil is turned on;
   turning off the second coil, wherein the second coil is turned on and off when the first coil is continuously turned on; and
   etching a material layer over the semiconductor substrate by using the plasma generated in the chamber.

9. The method as claimed in claim 8, further comprising:
   providing a grounded filter in the chamber; and
   intercepting charged particles in the plasma by the grounded filter.

10. The method as claimed in claim 8, further comprising:
    turning on the second coil to transform the process gas into another plasma; and
    turning off the first coil when the second coil is turned on.

11. The method as claimed in claim 8, wherein etching the semiconductor substrate is performed in a period of time from 10 sec to 60 sec.

12. The method as claimed in claim 8, wherein the process gas is supplied in a range from about 10 sccm to about 1000 sccm.

13. A method for forming a semiconductor structure, comprising:
    transferring a semiconductor substrate onto a carrier in a chamber;
    supplying a process gas via a gas inlet into the chamber;
    moving a coil module relative to the chamber from a first position to a second position, wherein the first position is located between the gas inlet and a filter in the chamber, and the second position is located between the filter and the carrier;
    turning on the coil module around the chamber to generate first plasma at the first position in the chamber, wherein the filter is grounded for intercepting charged particles in the first plasma when the first plasma passes through the filter;
    turning on the coil module around the chamber to generate second plasma at the second position in the chamber; and
    etching the semiconductor substrate by using the first plasma and the second plasma generated in the chamber.

14. The method as claimed in claim 13, further comprising:
    controlling a flow of the process gas into the chamber by a shutter disposed in the gas inlet.

15. The method as claimed in claim 13, wherein supplying the process gas further comprises supplying the process gas in a range from about 50 sccm to about 5000 sccm.

16. The method as claimed in claim 13, further comprising
    controlling a pressure of the chamber from about 10 mTorr to about 1 Torr.

17. The method as claimed in claim 13, further comprising
    controlling a power of the coil module in a range from about 10 W to about 500 W.

18. The method as claimed in claim 13, wherein supplying the process gas further comprises supplying the process gas via the gas inlet directly over the carrier.

19. The method as claimed in claim 13, further comprising:
    moving the coil module relative to the chamber from the second position to the first position.

20. The method as claimed in claim 13, wherein etching the semiconductor substrate comprises:
    forming a U-shaped recess in a fin structure of the semiconductor substrate using the second plasma.

* * * * *